US008042011B2

(12) United States Patent
Nicolaidis et al.

(10) Patent No.: US 8,042,011 B2
(45) Date of Patent: Oct. 18, 2011

(54) RUNTIME PROGRAMMABLE BIST FOR TESTING A MULTI-PORT MEMORY DEVICE

(75) Inventors: Michael Nicolaidis, Saint Egreve (FR); Silmane Boutobza, Grenoble (FR)

(73) Assignee: Synopsys, Inc., Mountain View, CA (US)

( * ) Notice: Subject to any disclaimer, the term of this patent is extended or adjusted under 35 U.S.C. 154(b) by 241 days.

(21) Appl. No.: 12/431,522

(22) Filed: Apr. 28, 2009

(65) Prior Publication Data

US 2010/0275074 A1 Oct. 28, 2010

(51) Int. Cl.
*G11C 29/00* (2006.01)
*G01R 31/28* (2006.01)

(52) U.S. Cl. ........ 714/718; 714/719; 714/720; 714/733; 714/736; 365/201

(58) Field of Classification Search .................. 714/718, 714/719, 720, 733, 736
See application file for complete search history.

(56) References Cited

U.S. PATENT DOCUMENTS

| | | | |
|---|---|---|---|
| 5,796,745 A | 8/1998 | Adams | |
| 5,812,469 A | 9/1998 | Nadeau-Dostie | |
| 6,070,256 A | 5/2000 | Wu | |
| 6,216,241 B1 * | 4/2001 | Fenstermaker et al. | 714/718 |
| 6,681,358 B1 * | 1/2004 | Karimi et al. | 714/733 |
| 7,139,204 B1 * | 11/2006 | Behera | 365/201 |
| 7,168,005 B2 * | 1/2007 | Adams et al. | 714/31 |
| 7,716,542 B2 * | 5/2010 | Chang et al. | 714/718 |

OTHER PUBLICATIONS

Boutobza et al., Programmable Memeory BIST, 2005, IEEE, Paper45.2, pp. 1-10.*

* cited by examiner

*Primary Examiner* — John J Tabone, Jr.
(74) *Attorney, Agent, or Firm* — Park, Vaughan, Fleming & Dowler LLP

(57) ABSTRACT

One embodiment provides a runtime programmable system which comprises methods and apparatuses for testing a multi-port memory device to detect a multi-port memory fault, in addition to typical single-port memory faults that can be activated when accessing a single port of a memory device. More specifically, the system comprises a number of mechanisms which can be configured to activate and detect any realistic fault which affects the memory device when two simultaneous memory access operations are performed. During operation, the system can receive an instruction sequence, which implements a new test procedure for testing the memory device, while the memory device is being tested. Furthermore, the system can implement a built-in self-test (BIST) solution for testing any multi-port memory device, and can generate tests targeted to a specific memory design based in part on information from the instruction sequence.

17 Claims, 11 Drawing Sheets

RUNTIME PROGRAMMABLE BIST FOR TESTING A MULTI-PORT MEMORY DEVICE

BACKGROUND

1. Field

This disclosure is generally related to electronic design automation. More specifically, this disclosure is related to methods and apparatuses for testing a multi-port memory device to detect a realistic fault.

2. Related Art

Multi-port memory devices are becoming more common with the increasing popularity of multi-processor computing systems. A multi-port memory device plays an important role in synchronizing the operations performed by two or more microprocessors of the computing system. Therefore, it is important that the multi-port memory device is thoroughly tested, and determined to be fault-free, before the memory device is integrated into the multi-processor computing system.

However, testing a multi-port memory device poses unique challenges, which cannot be addressed by methods and apparatuses typically used for testing a single-port memory device. More specifically, a realistic fault can occur in the multi-port memory device, such that the realistic fault can be activated when simultaneous memory access operations are performed on two ports of the memory device. To make matters worse, the realistic fault can belong to one of many possible fault models for a given memory design, such as inter-port faults and cell-array faults.

Inter-port faults include realistic faults which are caused by an interference between simultaneous memory access operations, such as a short or a coupling between a word-line and a bit-line. Furthermore, a cell-array fault can exist as a combination of two weak coupling faults (note that a weak fault occurs when an operation over a cell may perturb the state of that cell, such that the perturbation is not sufficiently strong to modify the state of the cell). If the two weak faults have an additive effect, and they are activated by two memory access operations performed simultaneously from two ports of the memory device, the two weak faults can change the state of a common coupled cell. Furthermore, a combination of two or more weak faults may result in a strong fault when the combination of weak faults are excited simultaneously from the different ports of the memory device.

Note that it is not feasible to perform an exhaustive set of tests on a multi-port memory device, because doing so requires testing all possible interactions that can be performed between the set of ports of the memory device, which can result in an overall test time that requires several years to complete. Therefore, a test engineer is typically responsible for developing a custom test procedure which can cover an ideal set of the fault models for the memory device under test, and for developing a custom testing apparatus which can apply the test procedure onto the memory device. Unfortunately, if the testing procedure is hard-wired into the testing apparatus, the memory cannot utilize a new test procedure which has been created after the testing apparatus is fabricated with the multi-port memory device. These new test algorithms may be required to perform a fault diagnosis, a failure analysis, or to perform production tests, when the initial test set does not satisfy the target fault coverage.

SUMMARY

One embodiment provides a programmable system which comprises methods and apparatuses for testing a multi-port memory device to detect a multi-port memory fault. More specifically, the system comprises a number of mechanisms which can be configured to activate and detect any realistic fault which affects the memory device when two simultaneous memory access operations are performed. Furthermore, these mechanisms can also allow the system to activate and detect typical single-port faults, which results in an overall high test quality for the multi-port memory device. While the memory device is being tested, the system can receive at runtime an instruction sequence which implements a new procedure for testing the memory device. The system can implement a built-in self-test (BIST) solution for testing any multi-port memory device, and can generate tests targeted to a specific memory design based in part on information from the instruction sequence.

Note that a multi-port memory fault can affect the memory device when a first memory cell is accessed via a first port of the memory device, and a second memory cell is accessed via a second port of the memory device. To detect the multi-port memory fault in the memory device, the system can generate test operations for the memory device based in part on a sequence of instructions which implement a memory test for exposing the multi-port memory fault. In some embodiments, the apparatus can include a scan register, which can receive the sequence of instructions while the apparatus tests the multi-port memory device. In other embodiments, the apparatus can generate a predetermined sequence of instructions, at runtime, which implement a preset test procedure.

In some embodiments, the system can generate a dedicated test for testing the multi-port memory device based in part on the sequence of instructions, such that some test operations of the dedicated test are applied to the memory device via a first port, and other test operations are applied to the memory device via a second port. The system then determines whether the multi-port memory fault occurs in the multi-port memory device by reading a value from a read port (which can be the first port or the second port of the multi-port memory device, or both ports, depending on a current test sequence and test operation of a test procedure), and determining whether the read value matches a corresponding expected binary value.

In some embodiments, the system can include an irregular-data-controller, which can invert the expected binary value when a binary value read from a first port will be different from the expected binary value because the read value was altered by a prior write operation via a second port of the multi-port memory device.

In some embodiments, the system provides methods for generating a test sequence based in part on a test procedure.

In some embodiments, the system provides methods and apparatuses for configuring a BIST memory tester to test the memory device.

Figure 1:
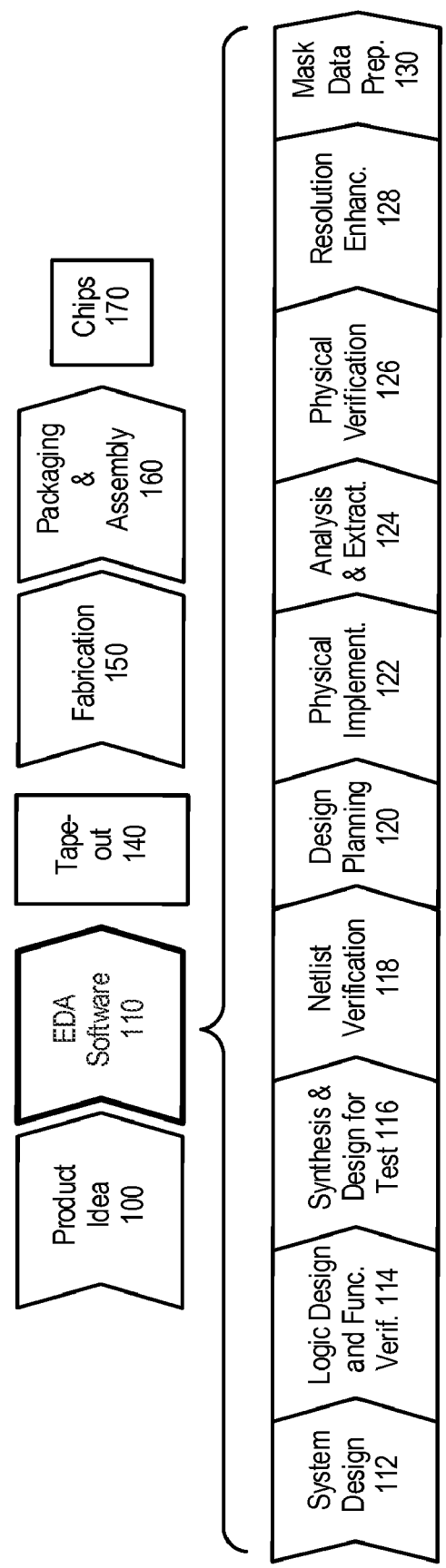
FIG. 1 illustrates various stages in the design and fabrication process of an integrated circuit in accordance with an embodiment.

TABLE 1 presents a number of exemplary test procedures for covering realistic faults in accordance with an embodiment.

TABLE 2 presents a number of conditions required for activating a realistic concurrent coupling fault in accordance with an embodiment.

TABLE 3 presents a compacted set of conditions which can detect a fault between neighboring cells in accordance with an embodiment.

TABLE 4 presents a number of conditions required for activating a duplex coupling fault in accordance with an embodiment.

TABLE 5 presents a number of fields associated with a test instruction for a memory tester in accordance with an embodiment.

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Integrated Circuit (IC) Design Flow

FIG. 1 illustrates various stages in the design and fabrication process of an integrated circuit in accordance with an embodiment.

The IC design process typically begins with a product idea (operation 100) which is realized using an EDA process (operation 110). Once the design is finalized, it is typically taped-out (event 140), at which point it goes through a fabrication process (operation 150) and packaging and assembly processes (operation 160) to produce manufactured microchips (result 170).

The EDA process (operation 110) comprises operations 112-130, which are described below for illustrative purposes only and are not meant to limit the present invention. Specifically, an actual integrated circuit design may require a designer to perform the design operations in a different sequence than the sequence described below.

System design (operation 112): In this stage, the designers describe the functionality that implements the product idea. They can also perform what-if planning to refine the functionality, perform cost analysis, etc. Hardware-software architecture partitioning can occur at this stage. Exemplary EDA software products from Synopsys, Inc. that can be used at this stage include Model Architect, Saber®, System Studio, and DesignWare®.

Logic design and functional verification (operation 114): At this stage, the VHDL or Verilog code for modules in the system is written and the design is checked for functional accuracy. More specifically, the design is checked to ensure that it produces a correct response. Exemplary EDA software products from Synopsys, Inc. that can be used at this stage include VCS®, Vera®, DesignWare®, Magellan™, Formality®, ESP and Leda®.

Synthesis and design for test (operation 116): The VHDL/Verilog source code can be translated to a netlist in this stage. The netlist can be optimized for the target technology, and tests can be designed and implemented to check the manufactured microchips. Exemplary EDA software products from Synopsys, Inc. that can be used at this stage include Design Compiler®, Physical Compiler®, Test Compiler, Power Compiler™, FPGA Compiler, TetraMAX®, and DesignWare®.

Netlist verification (operation 118): In this stage, the netlist is checked for compliance with timing constraints and for correspondence with the VHDL/Verilog source code. Exemplary EDA software products from Synopsys, Inc. that can be used at this stage include Formality®, PrimeTime®, and VCS®.

Design planning (operation 120): In this stage, an overall floorplan for the microchip is constructed and analyzed for timing and top-level routing. Exemplary EDA software products from Synopsys, Inc. that can be used at this stage include Astro™ and IC Compiler products.

Physical implementation (operation 122): The placement (positioning of circuit elements) and routing (placement of interconnections) occur at this stage. Exemplary EDA software products from Synopsys, Inc. that can be used at this stage include Astro™ and IC Compiler products.

Analysis and extraction (operation 124): At this stage, the circuit function is verified at a transistor level; this, in turn, permits what-if refinement. Exemplary EDA software products from Synopsys, Inc. that can be used at this stage include AstroRail™, PrimeRail, PrimeTime®, and Star-RCXT™.

Physical verification (operation 126): In this stage, the design is checked to ensure correctness for manufacturing, electrical issues, lithographic issues, and circuitry. Hercules™ is an exemplary EDA software product from Synopsys, Inc. that can be used at this stage.

Resolution enhancement (operation 128): This stage involves geometric manipulations of the layout to improve manufacturability of the design. Exemplary EDA software products from Synopsys, Inc. that can be used at this stage include Proteus/Progen, ProteusAF, and PSMGen.

Mask data preparation (operation 130): This stage provides the "tape-out" data for production of masks to produce finished chips. Exemplary EDA software products from Synopsys, Inc. that can be used at this stage include the CATS® family of products.

Memory Testing System

Embodiments of the present invention provide a built-in self-test (BIST) system which can test a multi-port memory device to detect a functional fault. The BIST memory tester can be integrated into the design of the multi-port memory device during the synthesis and design for test (DFT) stage of the memory device's design process (i.e., operation 116 of FIG. 1). In some embodiments, the multi-port memory device can be a random access memory (RAM) module. In other embodiments, the multi-port memory device can be a register file within an ASIC device.

Figure 2A:
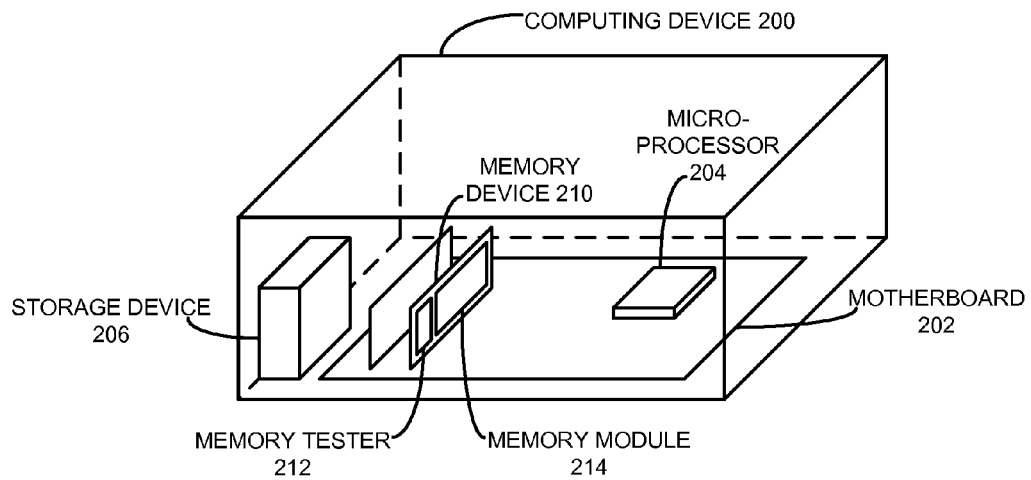
FIG. 2A illustrates a computing device which can benefit from the memory testing system in accordance with an embodiment.

FIG. 2A illustrates a computing device which can benefit from the memory testing system in accordance with an embodiment. Computing device 200 can include a motherboard 202, which in turn can include a microprocessor 204 and a memory device 210. Furthermore, memory device 210 can include a memory tester 212 and a memory module 214. In some embodiments, memory module 214 is a multi-port memory device, such that two or more ports of memory module 214 can be used simultaneously to access one or more memory cell of memory module 214. In other embodiments, memory module 214 can be a single-port memory device, such that memory tester 212 applies test via the single port of memory module 214. In further embodiments, memory tester 212 can also test a combination of single port and multi-port memory devices. In some embodiments, memory tester 212 can receive a sequence of instructions which implement a memory test procedure for testing memory module 214 for faults.

In some embodiments, computing device 200 can also include a storage device 206, which can store instructions that when executed by microprocessor 204, cause computing device 200 to perform a method for configuring memory tester 212 to test memory module 214 for faults. More specifically, these instructions can cause computing device 200 to provide memory tester 212 with a sequence of instructions which implement a memory test procedure for testing memory module 214 for faults. Memory tester 212 can receive these instructions, and can execute these instructions to generate one or more tests for memory module 214, and to apply the one or more tests to memory module 214.

In other embodiments, storage device 206 can store instructions that when executed by microprocessor 204, cause computing device 200 to perform a method for testing memory module 214 for multi-port memory faults. More specifically, these instructions can cause computing device 200 to generate one or more tests for memory module 214, and to apply the one or more tests to memory module 214.

Figure 2B:
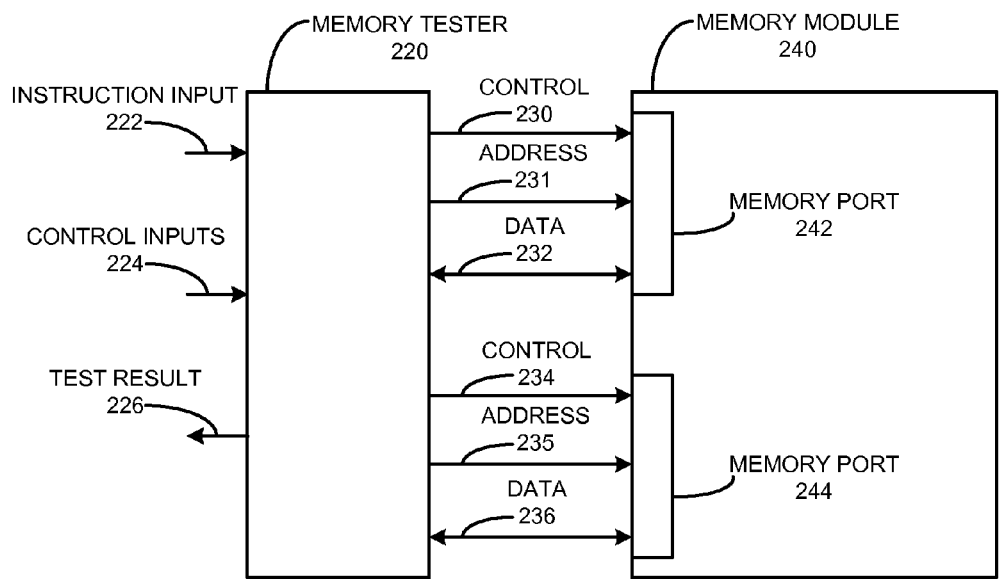
FIG. 2B illustrates a memory tester for performing tests on a multi-port memory device in accordance with an embodiment.

FIG. 2B illustrates a memory tester for performing tests on a multi-port memory device in accordance with an embodiment. Memory tester 220 can include an instruction input 222 and a number of control inputs 224, and can generate a test result 226 which specifies whether a fault is detected in memory module 214. Furthermore, memory module 240 can include memory ports 242-244, which can perform a simultaneous access on one or more memory cells of memory module 240.

In some embodiments, test result 226 includes a "static fail" signal, which is asserted high whenever a fault is detected, such that the "static fail" signal remains high until the test that detected the fault is completed. In some embodiments, test result 226 includes a "dynamic fail" signal, which indicates the current test result at each cycle of a test sequence. Note that the "dynamic fail" pin can be monitored to determine the exact test cycle at which a fault is detected. This can allow test engineers to determine the test sequence which activated the fault, the memory address within the current test sequence which caused the fault to be detected, and to count the number of fault incidents which are detected for a given test sequence.

During operation, memory tester 220 can receive a number of instructions via instruction input 222, which when executed by memory tester 220, causes memory tester 220 to generate one or more tests for memory module 240, and can cause memory tester 220 to apply the one or more tests to memory ports 242-244 of memory module 240. In some embodiments, memory tester 220 can perform a memory access operation on memory module 240 via memory port 242 using a control signal 230, an address signal 231, and a bidirectional data signal 232. Similarly, memory tester 220 can perform a memory access operation on memory module 240 via memory port 244 using a control signal 234, an address signal 235, and a bidirectional data signal 236. In some other embodiments, memory tester 220 can access memory module 240 via memory port 244, or simultaneously via both memory ports 242 and 244.

In some embodiments, memory tester 220 can apply a number of tests to memory module 240 to determine whether a multi-port memory fault occurs in memory module 240 (e.g., a concurrent coupling fault, or a complex coupling fault). In some embodiments, memory tester 220 performs a read and/or a write operation simultaneously on a coupling cell and a coupled cell which share a row and/or a column address of memory module 240, and then performs a read operation on the coupled cell to determine whether a coupling fault occurs on the coupled cell. In further embodiments, memory tester 220 can also perform a read operation on a cell which is physically adjacent to the coupled cell to determine whether a coupling fault occurs between the coupled cell and the adjacent cell.

In other embodiments, memory tester 220 performs a read and/or a write operation between two coupling cells in memory module 240, and then performs a read operation on a coupled cell which shares a row and/or a column address with the two coupling cells to determine whether a coupling fault occurs on the coupled cell. In some other embodiments, memory tester 220 can also perform a read operation on a cell which is adjacent to the coupled cell to determine whether a fault on the coupled cell also causes a fault on the adjacent cell.

In some embodiments, memory tester 220 can manage irregularities in test data for a given test sequence. This allows memory tester 220 to implement advanced test solutions which can detect all existing realistic multi-port faults (e.g., a realistic fault which is a combination of two or more weak faults).

Figure 3:
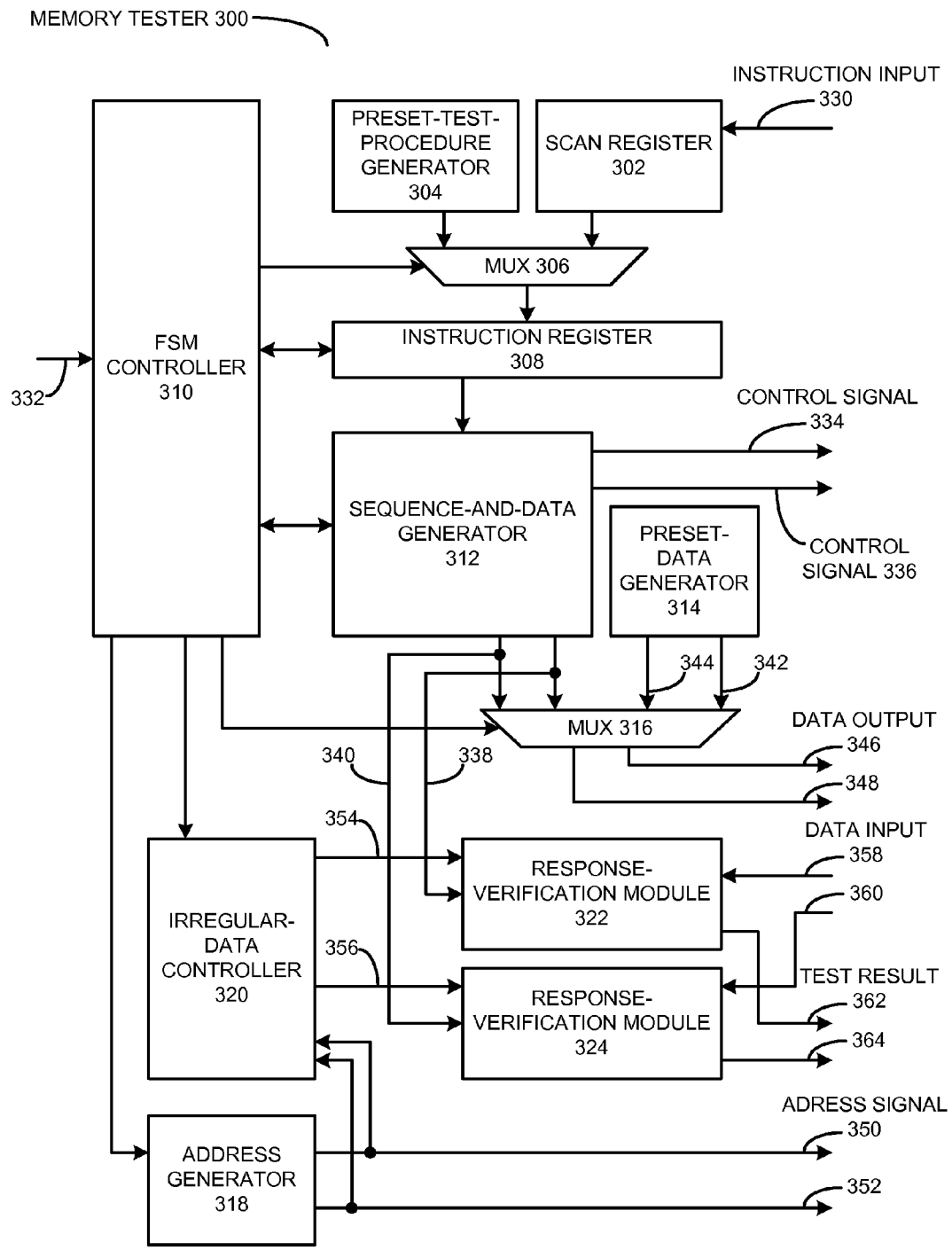
FIG. 3 illustrates an exemplary implementation for a memory tester in accordance with an embodiment.

FIG. 3 illustrates an exemplary implementation for a memory tester in accordance with an embodiment. Memory tester 300 can include a scan register 302, a preset-test-procedure generator 304, an instruction register 308, a finite-state-machine (FSM) controller 310, a sequence-and-data generator 312, a preset-data generator 314, an address generator 318, an irregular-data controller 320, and response-verification modules 322-324.

During operation, scan register 302 can receive a sequence of instructions via an instruction input 330, such that the sequence of instructions implements a test procedure for testing a multi-port memory device for faults. In some embodiments, instruction input 330 can be a serial interface comprising a clock signal and a serial data signal. In other embodiments, instruction input 330 can be a parallel interface comprising a plurality of data signals.

In some embodiments, memory tester 300 can utilize a predetermined test procedure by configuring a preset-test-procedure generator 304 to generate, at runtime, a sequence of instructions which implement the predetermined test procedure. For example, preset-test-procedure generator 304 can be configured to generate tests which implement typical memory test procedures, and/or implement an early version of a test procedure for a given memory device.

In some embodiments, instruction register 308 can receive a sequence of instructions from scan register 302 or from preset-test-procedure generator 304. During operation, memory tester 300 can configure a multiplexer 306 to provide instruction register 308 with instructions from scan register 302, or from preset-test-procedure generator 304. For example, multiplexer 306 can be configured to provide instruction register 308 with an instruction sequence from preset-test-procedure generator 304 when applying default memory tests to a memory device. Then, once a new test procedure is created for a given memory device, scan register 302 can be configured to receive the instruction sequence which implements the new test procedure.

In some embodiments, scan register 302 can receive a sequence of instructions while memory tester 300 is applying tests to the multi-port memory device. This is important to ensure that a test procedure is not interrupted between test sequences, which allows for at-speed testing between sequences, and to shorten the overall test time as well. Furthermore, memory device 300 can execute a test algorithm of any complexity (e.g., test length) without being limited by the capacity of instruction register 308 by receiving the instruction sequence from an external storage device while applying tests to the memory device.

In some embodiments, sequence-and-data generator 312 can generate control signals 334-336, and can generate data signals 338-340. Control signals 334-336 can control the memory access operations performed on the access ports of the multi-port memory device. For example, control signal 334 can activate a memory access operation on a first port of the multi-port memory device, and can specify whether the memory access operation is a read operation or a write operation. Similarly, control signal 336 can active a memory access operation on a second port of the multi-port memory device, and can specify whether the memory access operation is a read operation or a write operation.

In some embodiments, data signal 338 can specify a signal value associated with a write operation for a first port of the multi-port memory device. Similarly, data signal 340 can specify a signal value associated with a write operation for a second port of the multi-port memory device.

In other embodiments, data signal 338 can specify an expected data value associated with a read operation from a first port of the multi-port memory device. Similarly, data signal 340 can specify an expected data value associated with a read operation from a second port of the multi-port memory device.

In some embodiments, preset-data generator 314 can generate a predetermined data value for data signal 342, which corresponds to a write operation on the first port of the multi-port memory device. Furthermore, preset-data generator 314 can generate a predetermined data value for data signal 344, which corresponds to a write operation on the second port of the multi-port memory device. Note that the data values in data signals 342-344 can correspond to test instructions generated by preset-test-procedure generator 304.

In some embodiments, preset data generator 314 can expand compressed data (received from instruction register 308) to fit a given memory data width for data signals 346-348 and 358-360. For example, the compressed data can be coded using three bits (e.g. 001). Therefore, if the memory data width is of size 8, then preset data generator 314 can apply the data background pattern 00100100 to the memory device when there is no data inversion for the current test operation. Otherwise, if there is a data inversion for the current test operation, preset data generator 314 can apply the data background pattern 11011011 to the memory device.

In some other embodiments, preset data generator 314 can generate data signals 342-344 based in part on address signals 350-352. For example, preset data generator 314 can include a memory cache which stores a number of basic data background pattern words (e.g., eight data background pattern words). Furthermore, preset data generator 314 can use the least significant bits from an address signal (e.g., signals A0, A1 and A2 from address signal 350) to select a cache entry, thereby generating a data background pattern of eight memory words which repeats after every eight memory locations.

In some embodiments, data outputs 346-348 can receive data values for a write operation from sequence-and-data generator 312, or from preset-data generator 314. During operation, memory tester 300 can configure a multiplexer 316 to provide data output 346 with a data value from data signal 338, or from data signal 342. Similarly, memory tester 300 can configure multiplexer 316 to provide data output 348 with a data value from data signal 340, or from data signal 344.

In some embodiments, memory tester 300 can configure address generator 318 to provide an address signal 350 with a memory address associated with a memory access operation on the first port of the multi-port memory device. Furthermore, memory tester 300 can configure address generator 318 to provide an address signal 352 with a memory address associated with a memory access operation on the second port of the multi-port memory device. Note that address generator 318 can be further configured to generate a sequence of memory addresses for a test procedure which sweeps down a column of memory cells of the memory device, and can be configured to generate a sequence of memory addresses for a test procedure which sweeps across a row of memory cells.

Note that in some test procedures, the memory access operation performed on the second port of the multi-port memory device can be associated with a memory cell which is one row ahead or behind the memory access operation on the first port of the multi-port memory device. Furthermore, the memory access operation performed on the second port of the multi-port memory device can be associated with a memory cell which is one column ahead or behind the memory access operation on the first port of the multi-port memory device. Therefore, when a test procedure applies a test across a complete row (or down a column) of the multi-port memory device where a read operation is performed on a memory cell which is one row (or column) ahead of a simultaneous write operation, the expected data value for the last read operation can be different than the expected data value for any other read operation for the test procedure.

This observation is referred to as an "irregular data pattern," and memory tester 300 can account for this irregular data pattern by inverting the expected data value when performing the last read operation of the test procedure which sweeps across a complete row (or down a column) of the multi-port memory device. In some embodiments, irregular-data controller 320 can determine when the expected data value needs to be inverted to account for an irregular data pattern. When irregular-data controller 320 determines that an expected data value needs to be inverted for a read operation on the first port of the multi-port memory device, irregular-data controller 320 can generate an invert signal value for an IR signal 354. Furthermore, when irregular-data controller 320 determines that an expected data value needs to be inverted for a read operation on the second port of the multi-port memory device, irregular-data controller 320 can generate an invert signal value for an IR signal 356. In some embodiments, the invert signal value can be a logic one value. In other embodiments, the invert signal value can be a logic zero value.

In some embodiments, test results 362-364 can include a "static fail" signal, which is asserted high whenever a fault is detected, such that the "static fail" signal remains high until the test that detected the fault is completed. In other embodiments, test results 362-364 can include a "dynamic fail" signal, which indicates the current test result outcome for a given cycle of a test sequence. Note that the "dynamic fail" pin can be monitored to determine the exact test cycle at which a fault is detected. This can allow test engineers to determine the test sequence which activates a given fault, the memory address within the current test sequence which causes the fault to be detected, and to count the number of fault incidents which are detected for a given test sequence.

In some embodiments, response-verification module 322 can determine whether a data value associated with a read operation on the first port matches an expected data value for the read operation. To do so, response-verification module 322 compares the data value received via data input 358 to an expected data value received via data signal 338. If the two data values do not match, then response-verification module 322 generates an error signal value for test result 362 to specify that a fault has been detected on the memory cell accessed by the read operation on the first port. Otherwise, if the two data values match, then the accessed memory cell is determined to be fault-free, and response-verification module 322 does not generate the error signal value for test result 362. In some embodiments, the error signal value is a logic one value. In other embodiments, the error signal value is a logic zero value.

In some embodiments, response-verification module 322 can receive an invert signal value via IR signal 354, which notifies response-verification module 322 that the data value received via data input 358 is associated with an irregular data pattern. Therefore, when response-verification module 322 receives the invert signal value via IR signal 354, response-verification module 322 inverts the expected data value received via data signal 338, and compares the inverted expected data value to the data value received via data input 358 to determine whether the two data values match. If the two data values do not match, then response-verification module 322 generates an error signal value for test result 362 to specify that a fault has been detected on the memory cell accessed by the read operation. Otherwise, if the two data values match, then the accessed memory cell is determined to be fault-free, and response-verification module 322 does not generate the error signal value for test result 362.

In some embodiments, response-verification module 324 can determine whether a data value associated with a read operation on the second port matches an expected data value for the read operation. To do so, response-verification module 324 compares the data value received via data input 360 to an expected data value received via data signal 340. If the two data values do not match, then response-verification module 324 generates an error signal value for test result 364 to specify that a fault has been detected on the memory cell accessed by the read operation on the second port. Otherwise, if the two data values match, then the accessed memory cell is determined to be fault-free, and response-verification module 324 does not generate the error signal value for test result 364

In some embodiments, response-verification module 324 can receive an invert signal value via IR signal 356, which notifies response-verification module 324 that the data value received via data input 360 is associated with an irregular data pattern. Therefore, when response-verification module 324 receives the invert signal value via IR signal 356, response-verification module 324 inverts the expected data value received via data signal 340, and compares the inverted expected data value to the data value received via data input 360 to determine whether the two data values match. If the two data values do not match, then response-verification module 324 generates an error signal value for test result 364 to specify that a fault has been detected on the memory cell accessed by the read operation. Otherwise, if the two data values match, then the accessed memory cell is determined to be fault-free, and response-verification module 324 does not generate the error signal value for test result 364.

Figure 4:
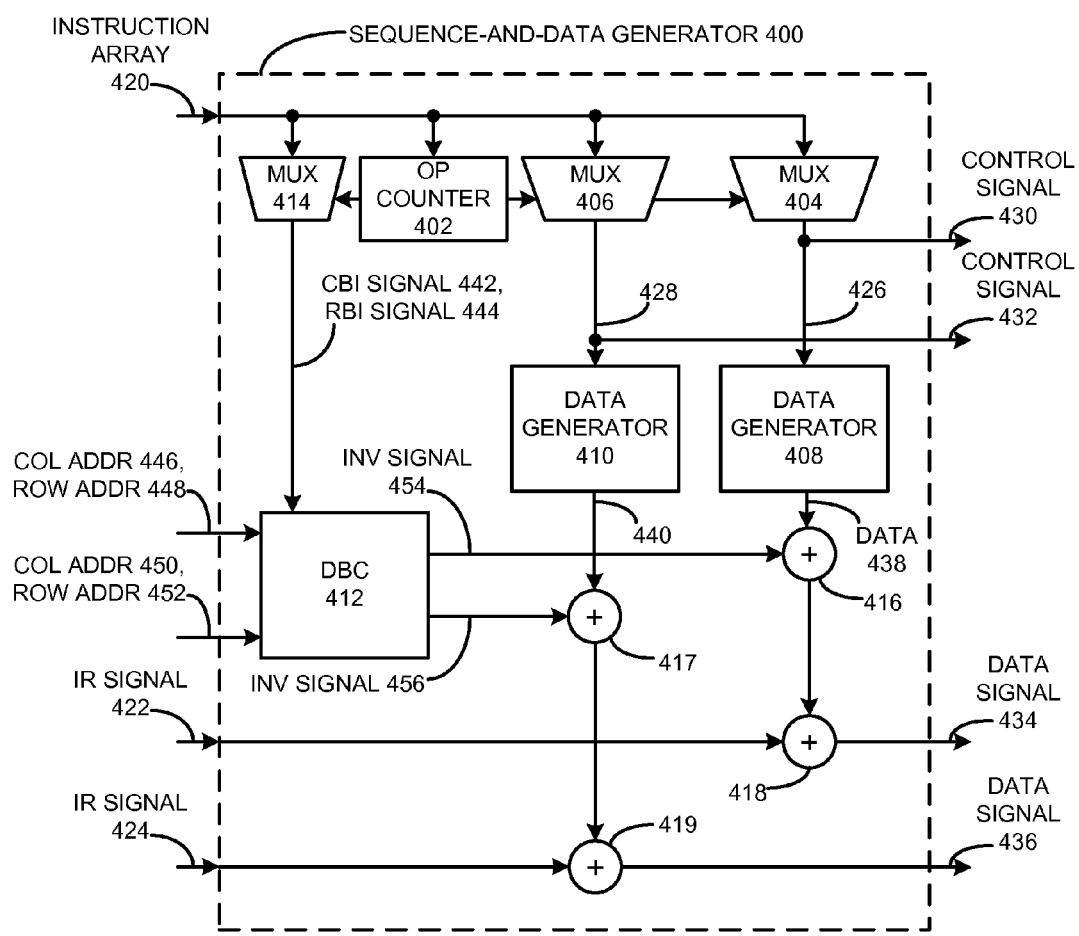
FIG. 4 illustrates an exemplary implementation for a sequence-and-data generator in accordance with an embodiment.

FIG. 4 illustrates an exemplary implementation for a sequence-and-data generator in accordance with an embodiment. In some embodiments, sequence-and-data generator 400 can include an op counter 402, multiplexers 404-406, data generators 408-410, and a data-background-controller (DBC) 412. In some embodiments, sequence-and-data generator 400 can generate a value for a control signal 430, which controls a memory access operation on a first port of a multi-port memory device. Furthermore, sequence-and-data generator 400 can generate a value for a control signal 432, which controls a memory access operation on a second port of the multi-port memory device.

In some embodiments, sequence-and-data generator 400 can generate a value for a data signal 434, which can be either an expected data value associated with a read operation on the first port of the multi-port memory device, or a data value associated with a write operation on the first port of the multi-port memory device. Furthermore, sequence-and-data generator 400 can generate a value for a data signal 436, which can be either an expected data value associated with a read operation on the second port of the multi-port memory device, or a data value associated with a write operation on the second port of the multi-port memory device.

In some embodiments, an instruction register for the memory device includes at least a set of fields which include the test operations for a memory test sequence, such that the number of these fields can determine the maximum number of operations for the test sequence. In some embodiments, op-counter 402 iterates successively through the different test operation fields of the instruction register, and applies the test operations to the memory device. For example, op-counter 402 can be a down-counter, such that when a memory address 00 . . . 00 is reached, op-counter 402 asserts a control signal 430 which informs an FSM controller of the memory device that a test sequence has been completed at the current memory address. This can cause an address generator of the memory device to cycle to the next memory address (e.g., cycles up to the next memory address for an up-addressing memory scheme, or cycles down to the preceding memory address for a down-addressing scheme), at which point the memory test sequence is repeated.

In some embodiments, multiplexer 404 can select a value for instruction signal 426 from an instruction array 420 (i.e., an instruction register) based in part on the instruction register address provided by op counter 402. Similarly, multiplexer 406 can select a value for instruction signal 428 from instruction array 420 based in part on the instruction register address. Note that control signal 430 can be extracted from instruction signal 426, and that control signal 432 can be extracted from instruction signal 428.

In some embodiments, data generator 408 can generate a data value for a data signal 438 based in part on instruction signal 426. Similarly, data generator 410 can generate a data value for a data signal 440 based in part on instruction signal 428. Note that data signals 438-440 can correspond to expected data values from read operations on the multi-port memory device, and can correspond to data values for write operations on the multi-port memory device.

In some embodiments, DBC 412 can cause sequence-and-data generator 400 to perform a sequence of write operations on the multi-port memory device which store a repeating data pattern (also known as a "background pattern") across a segment of the memory device. The nature of the background pattern is specified by the test instruction, and is upheld across a test sequence associated with the test instruction. In some embodiments, DBC 412 can also cause sequence-and-data generator 400 to account for a background pattern of a test sequence when generating an expected data value for a read operation on the memory device, such that the expected data value accounts for variations in the data pattern stored on the memory device. During operation, DBC 412 can accept a column address 446 and a row address 448 for the first port, and can accept a column address 450 and a row address 452 for the second port. Furthermore, DBC 412 can accept a column-background-inversion (CBI) signal 442, and can accept a row-background-inversion (RBI) signal 444 from a multiplexer 414.

In a first example, when CBI signal 442 is set (e.g., has a logic one value) and RBI signal 444 is not set (e.g., has a logic zero value), DBC 412 can set an invert (INV) signal 454 to a logic one value when performing a memory access operation across alternating columns of the memory device. By doing so, DBC 412 can configure a logic inverter 416 to invert data signal 438 when an access operation on the first port corresponds to alternating columns of the memory device. Furthermore, DBC 412 can set an INV signal 456 to a logic one value when performing a memory access operation across the same alternating columns of the memory device. By doing so, DBC 412 can configure a logic inverter 417 to invert data signal 440 when an access operation on the second port corresponds to the same alternating columns which are inverted on the first port. This configuration implements a column-strip background scenario, such that two memory cells from a given column of the memory device store a matching data value, and two memory cells from neighboring columns store inverted data values.

In a second example, when CBI signal 442 is not set (e.g., has a logic zero value) and RBI signal 444 is set (e.g., has a logic one value), DBC 412 can set INV signal 454 to a logic one value when performing a memory access operation down alternating rows of the memory device. By doing so, DBC 412 can configure a logic inverter 416 to invert data signal 438 when an access operation on the first port corresponds to alternating rows of the memory device. Furthermore, DBC 412 can set INV signal 456 to a logic one value when performing a memory access operation down the same alternating rows of the memory device. By doing so, DBC 412 can configure a logic inverter 417 to invert data signal 440 when an access operation on the second port corresponds to the same alternating rows which are inverted on the first port. This configuration implements a row-strip background scenario, such that two memory cells from a given row of the memory device store a matching data value, and two memory cells from neighboring rows store inverted data values.

In a third example, when CBI signal 442 and RBI signal 444 are both set (e.g., have a logic one value), DBC 412 can set INV signal 454 to a logic one value when performing a memory access operation down alternating rows or across alternating columns of the memory device. By doing so, DBC 412 can configure a logic inverter 416 to invert data signal 438 when an access operation on the first port corresponds to alternating rows or alternating columns of the memory device. Furthermore, DBC 412 can set INV signal 456 to a logic one value when performing a memory access operation down alternating rows or across alternating columns of the memory device. By doing so, DBC 412 can configure a logic inverter 417 to invert data signal 440 when an access operation on the second port corresponds to the same alternating rows or alternating columns which are inverted on the first port. This configuration implements a checkerboard background scenario, such that any two neighboring memory cells across a given row or column of the memory device store inverted data values. In some embodiments, the INV signal for a port i of the multi-port memory device is computed by the Boolean expression: $INV_i = CBI$ and $C0_i$ xor $RBI$ and $R0_i$, where $C0_i$ and $R0_i$ are the least-significant bits (LSB) from the column and row addresses for port i, respectively.

In some embodiments, sequence-and-data generator 400 can account for an irregular data pattern. During operation, sequence-and-data generator 400 takes an IR signal 422 as input, which can configure a logic inverter 418 to invert the output of logic inverter 416 when IR signal 422 has a logic one value. Furthermore, sequence-and-data generator 400 takes an IR signal 424 as input, which can configure a logic inverter 419 to invert the output of logic inverter 417 when IR signal 424 has a logic one value. The outputs of logic inverter 418 and logic inverter 419 are propagated to data signal 434 and data signal 436, respectively.

Figure 5:
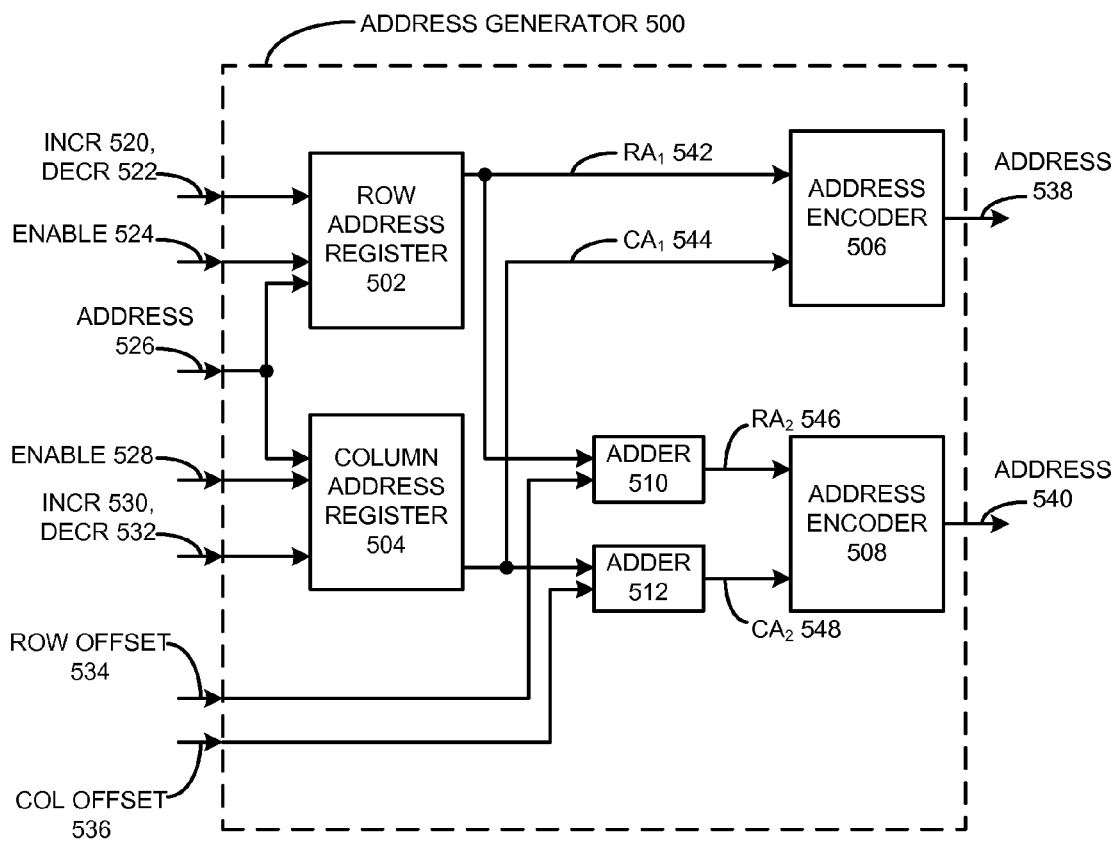
FIG. 5 illustrates an exemplary implementation for an address generator in accordance with an embodiment.

FIG. 5 illustrates an exemplary implementation for an address generator in accordance with an embodiment. Address generator 500 can generate an address 538 which corresponds to a memory access operation on a first port of the multi-port memory device, and can generate an address 540 which corresponds to a memory access operation on a second port of the multi-port memory device. In some embodiments, address generator 500 can include a row address register 502, a column address register 504, and adders 510-512.

During operation, row address register 502 stores a row address value (RA) 542 for a memory access operation on the first port of the memory device, and column address register 504 stores a column address value (CA) 544 for a memory access operation on the first port of the memory device. Furthermore, address encoder 506 generates address 538 based on the outputs of row address register 502 and column address register 504. In some embodiments, address encoder 506 can generate address 538 by multiplying RA 542 with the number of columns in the memory device, and then adding CA 544 (i.e., row-major order). In other embodiments, address encoder 506 can generate address 538 by multiplying CA 544 with the number of rows in the memory device, and then adding RA 542 (i.e., column-major order).

In some embodiments, row address register 502 and column address register 504 can be implemented using up/down binary counters. Row address register 502 can update its value by storing the address value in address 526 when an enable signal 524 is activated. Furthermore, row address register 502 can increment RA 542 when an increment (INCR) signal 520 is activated, and can decrement RA 542 when a decrement (DECR) signal 522 is activated. Similarly, column address register 504 can update its value by storing the address value in address 526 when an enable signal 528 is activated. Furthermore, column address register 504 can increment CA 544 when an INCR signal 530 is activated, and can decrement CA 544 when a DECR signal 532 is activated.

In some embodiments, adder 510 can generate a row address value (RA) 546 for a memory access operation on the second port of the memory device by adding a row offset 534 to RA 542. Similarly, adder 512 can generate a column address value (CA) 548 for a memory access operation on the second port of the memory device by adding a column offset 536 to CA 544. Furthermore, address encoder 508 can generate address 540 based on the outputs of adders 510-512. In some embodiments, address encoder 508 can generate address 540 by multiplying RA 546 with the number of columns in the memory device, and then adding CA 548 (i.e., row-major order). In other embodiments, address encoder 508 can generate address 540 by multiplying CA 548 with the number of rows in the memory device, and then adding RA 546 (i.e., column-major order).

Target Fault Models and Supported Test Procedures

An effective test solution for a multi-port memory device accounts for specific dual-port (DP-RAM) fault models, and accounts for single-port (SP-RAM) fault models that can affect the memory device when a memory access operation is performed on one memory port alone. Furthermore, the test solution also tests for all possible concurrent memory access modes. For example, when testing a read-write (RW) port, the test solution performs a read memory access and a write memory access on the RW port. Furthermore, the test solution also accounts for a complete combination of memory port operations for a multi-port memory device. For example, when testing a two-port memory device with an RW port and a read-only (RO) port, the test solution tests the memory device by exercising the RW port in read and write modes while the RO port is accessed in a read mode.

In some embodiments, procedure for the test solution can be represented using a march test notation. A march test is delimited by curly brackets (i.e., '{,' and '}'), and includes a sequence of march elements that are separated by semicolons. Furthermore, a march element includes a symbol which denotes an addressing order, which is followed by a sequence of operations that are separated by commas and delimited by parentheses. An operation can be either a read operation with an expected value of zero or one (i.e., r0, r1, respectively), or a write operation with a value of zero or one (i.e., w0, w1, respectively).

The symbol for the addressing order can be an up arrow, a down arrow, or an up-down arrow. The up arrow ⇑ denotes an up-addressing order, which can correspond to a linearly increasing memory address. The down arrow (⇓) denotes a down-addressing order, which can correspond to a linearly decreasing memory address. The up-down arrow (⇕) specifies that either an up-addressing order or a down-addressing order can be used. The Backus-Naur form (BNF) grammar rules for a march test are as follows:

⟨march test⟩::="{" ⟨march element⟩{";" ⟨march element⟩} "}"

⟨march element⟩::=⟨addressing order⟩"(" ⟨operation⟩{"," ⟨operation⟩} ")"

⟨addressing order⟩::=⇑ | ⇓ | ⇕

⟨operation⟩::=r0|r1|w0|w1

In some embodiments, the test solution can provide test quality by accounting for the following fault models:

SP-RAM functional fault models that can be covered by a march test. These faults correspond to a memory access operation on a single port of a memory device, and can include single-cell fault models, such as stuck-at faults (SAF), transition faults (TF), stuck-open (SO) faults, retention faults (RF), and read-disturb faults (RDF). Furthermore, these faults can include coupling faults (CFs) that affect two neighboring cells, which include idempotent coupling faults (CFid), inverse coupling faults, state coupling faults, and disturb coupling faults (CFd).

Specific DP-RAM fault models. These faults cannot be detected by traditional tests for SP-RAMs, because they require a simultaneous memory access operation on two memory ports of the memory device. These faults can include DP-RAM inter-port faults, and cell-array faults.

Figure 6:
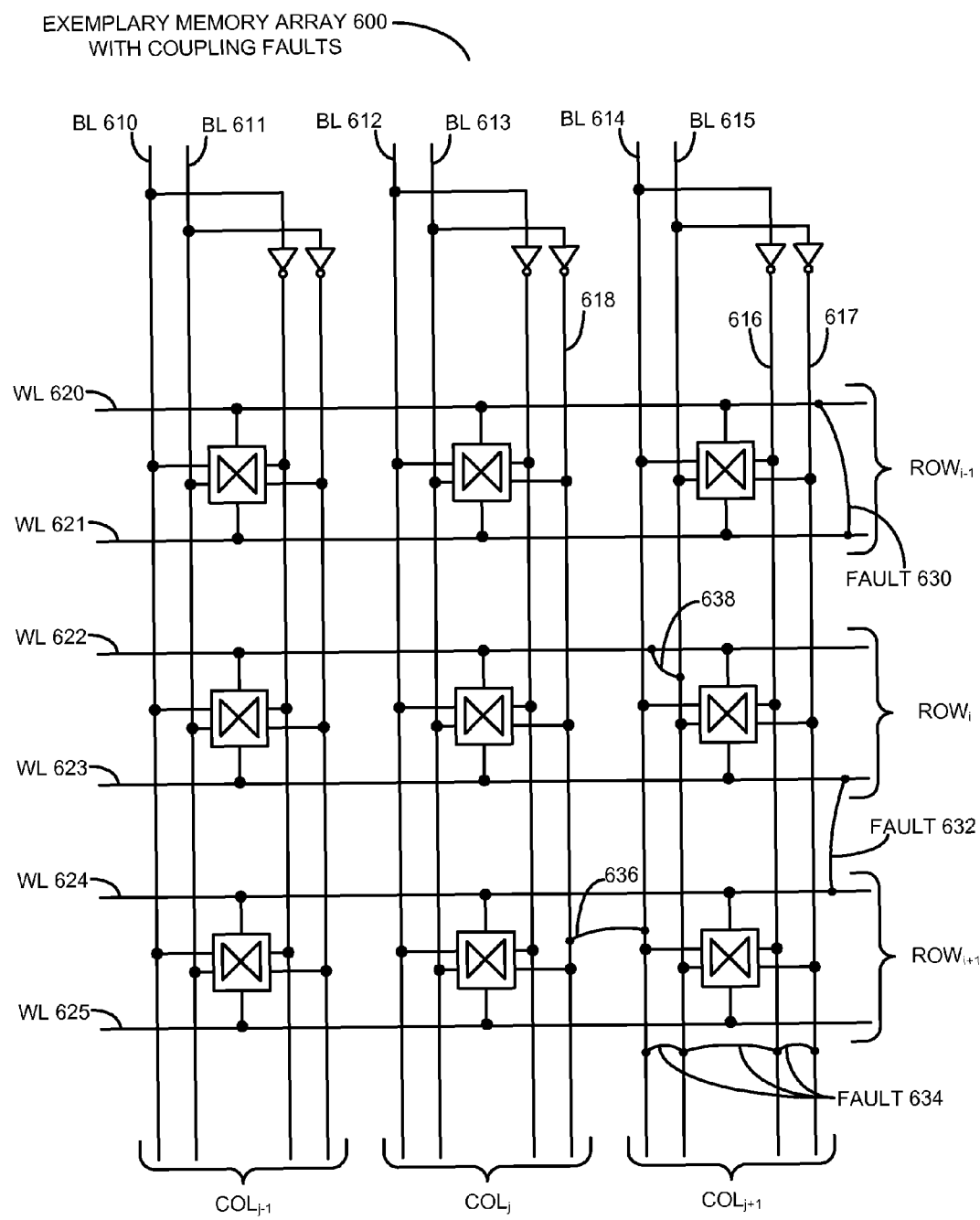
FIG. 6 illustrates an exemplary memory array with a number of coupling faults in accordance with an embodiment.

FIG. 6 illustrates an exemplary memory array with a number of coupling faults in accordance with an embodiment. Memory array 600 can include a number of bit lines (e.g., BL 610-618), and can include a number of word lines (e.g., WL 620-625). For illustration purposes, memory array 600 also includes coupling faults 630-638, which represent a variety of possible fault types that can occur on a memory device. Furthermore, coupling faults 630-638 can cause a memory cell of memory array 600 to experience a change in value when two ports of a multi-port memory device are accessed simultaneously.

Note that DP-RAM inter-port faults include faults which correspond to an interference between memory access operations on two ports of a multi-port memory device (e.g., shorts and coupling between word lines and bit lines of a memory array). For example, a DP-RAM can encounter a short between word lines for adjacent rows (e.g., fault 632, which couples WL 623 to WL 624), or can encounter a short between word lines for a single row (e.g., fault 630, which couples WL 620 to WL 621). Furthermore, a DP-RAM can encounter a short between bit lines for adjacent columns (e.g., fault 636, which couples BL 618 to BL 614), or can encounter a short between bit lines for a single column (e.g., fault 634, which couples two or more bit lines from the set 614-617). A DP-RAM can also encounter a short between a word line and a bit line for a given memory cell (e.g., fault 638, which couples WL 622 to BL 615).

Note that, when generating a test sequence for detecting fault 632 (i.e., a short between word lines for adjacent rows) of a memory device, the memory device needs to be analyzed to determine how fault 632 can affect it. A memory access to cell $C_{i+1,j+1}$ via port 1 activates WL 624. However, fault 632 can cause a word-line accessed by port 2 (i.e., WL 623) to also become activated, which can allow access to cell $C_{i,j+1}$. Therefore, a parallel write operation to any cell on column j+1, (e.g. a write operation on port 2 for cell $C_{i-1,j+1}$) can cause a write operation on cell $C_{i,j+1}$. Likewise, a read operation from port 2 on cell $C_{i-1,j+1}$ can also cause a read operation on cell $C_{i,j+1}$.

In some embodiments, fault 632 can be detected by performing simultaneous memory access operations on two ports of a multi-port memory device. For example, a memory access operation on memory cell $C_{i+1,j+1}$ of memory array 600 via port 1 can also activate WL 623 of cell $C_{i,j+1}$, for port 2. Therefore, if cell $C_{i,j+1}$ holds an initial value v, then a write operation that writes $\bar{v}$ on a cell in column j+1 via port 2 also writes $\bar{v}$ onto cell $C_{i,j+1}$. To detect fault 632, a read operation is performed on cell $C_{i,j+1}$ to determine that the read value ($\bar{v}$) does not match the expected value (v). Note that an SP-RAM test cannot detect fault 632, because it does not perform simultaneous access operations on two ports of a multi-port memory device.

In some embodiments, a cell-array fault includes a complex (duplex) coupling fault (CF) and a concurrent coupling fault. A duplex coupling fault (CFdx) affects the memory device when the effects of two weak coupling faults are combined. Note that a weak coupling can affect the memory device when an operation over a coupling cell may perturb the state of a coupled cell, but the perturbation caused by the coupling fault is not sufficiently strong to modify the state of the coupled cell. Therefore, if two weak coupling faults affect a given coupled cell, and the two weak coupling faults are activated simultaneously via two ports of the memory device, then the combined perturbations caused by the individual coupling faults can change the state of the coupled cell. Furthermore, a concurrent coupling fault (CFcr) can affect the memory device when the result of a memory access operation on a coupled cell ($C_i$) is affected by a simultaneous memory access operation on a coupling cell ($C_j$). Note that to detect a concurrent coupling fault on a multi-port memory device, two memory access operations are performed simultaneously through two ports of the multi-port memory device.

Note that fault models for a multi-port memory device can be categorized into three groups: (i) faults which involve a single cell, such that the aggressive cell is the same as the victim cell (e.g., combinations of weak RDFs); (ii) faults which involve two cells (e.g., a weak CFid or a weak CFd, which is combined with a weak TF and a weak RDF); and (iii) faults which involve three cells, such that two different aggressor cells influence a given victim cell (e.g., a combination of multiple weak CFds, or a combination of a weak CFid with a weak CFd).

Note that an exhaustive test strategy which supports all DP-RAM test procedures is not a realistic test solution, given that it can result in a BIST solution with a large area overhead and a long execution time. More specifically, a typical functional test which covers DP-RAM faults does not take into account the locations of the cells which are coupled within the cell array of a multi-port memory device. Therefore, a typical functional test may consider all combinations of two cells for a set of n cells in the memory device, thereby resulting in an expensive test complexity (i.e., $O(n^2)$ test complexity). To minimize the unnecessary complexity of a test procedure, the set of test operations which are supported by the BIST memory tester should be carefully selected.

In some embodiments, a test procedure performs a topological test strategy, which exploits the physical structure of a memory device to reduce the complexity of a test sequence for the memory device. For example, when performing two simultaneous memory access operations on the memory device, the two memory access operations can be restricted to adjacent cells of the memory device. This topological test strategy can reduce the test complexity to a linear complexity (i.e., O(n) complexity), given that the interactions targeted by the test procedure are between adjacent cells of the memory device. Furthermore, note that the topological test strategy does not significantly reduce the quality of the fault coverage, given that the simultaneous memory access operations which are not performed by the test procedure have a substantially low probability of detecting a unique multi-port memory fault (i.e., a multi-port memory fault that cannot be detected by the topological test strategy).

Note that the implementation of a topological test strategy requires information about the physical structure of the memory device (e.g., a number of rows/columns for the memory device), which can vary across memory devices.

Realistic Fault Models

In some embodiments, a test procedure considers primarily a realistic fault model, which accounts for faults that have been proven to occur in real life designs (as opposed to theoretical fault models). In the case of electromagnetic interferences for instance, a realistic fault model accounts for adjacent memory cells which share a row or a column of the memory device. The following paragraphs describe test procedures for the realistic fault mode by using a DP-RAM test notation, which resembles the march test notation.

Note that a DP-RAM test notation can differ from the march test notation in two ways: (i) every port can have an independent addressing order (e.g., an up-addressing or down-addressing, which can correspond to the x (fast x) or the y (fast y) direction); and (ii) a memory access operation can use two indices (i,j) to indicate an offset upon the reference row address and the reference column address.

This full flexibility is required only when functional fault models have to be supported. When targeting realistic faults, the test notation can be simplified based on a number of properties for realistic faults. For example, the port 2 address has the same addressing order (i.e., up-addressing or down-addressing) as the port 1 address, and can have the same direction (i.e., along an x, y or z axis) as the port 1 address. Furthermore, a port offset is limited to the set {0,1}. Based on these simplifications, the Backus-Naur form (BNF) grammar rules for a DP-RAM test are as follows:

⟨DP-RAM test⟩::="{" ⟨test element⟩{ ";" ⟨test element⟩} "056"

⟨test element⟩::=⟨p1ad⟩[ ⟨p1m⟩] ":" ⟨port offset⟩⟨inversion rule⟩] "(" ⟨memory operation⟩{ "," ⟨memory operation⟩} ")"

⟨p1ad⟩::=⇑ | ⇓ | ⇕

⟨p1m⟩::=x|y

⟨port offset⟩::="[" ⟨p2co⟩"," ⟨p2ro⟩"]"

⟨p2co⟩::=0|1

⟨p2ro⟩::=0|1

⟨memory operation⟩::=⟨port 1 operation⟩":"⟨port 2 operation⟩

⟨port 1 operation⟩::=r0|r1|r?|rx|w0|w1|N

⟨port 2 operation⟩::=r0|r1|r?|rx|w0|w1|N

⟨inversion rule⟩::="⟨"⟨cib⟩","⟨rib⟩"⟩"

⟨cib⟩::=0|1

⟨rib⟩::=0|1

A DP-RAM test can include a sequence of one or more test elements. Note that p1ad specifies an addressing order for port 1 of a multi-port memory device, and p1m optionally specifies its mode (x corresponds to fast x, and y corresponds to fast Y). Furthermore, a test element specifies, for port 2 of the memory device, a port address offset from port 1 of the memory device. That is, p2co of the test element specifies a column offset from the column address of port 1, and p2ro specifies a row offset from the row address of port 1.

Note that a memory operation includes an operation for each port of the memory device, such that the two port operations are separated by a colon. The two port operations of a memory operation are performed simultaneously.

In some embodiments, a port operation can be a read operation (r), a write operation (w), or a null operation (N). A port operation can either be a read operation with an expected value of zero or one (i.e., r0 or r1, respectively), or can be a write operation with a value of zero or one (i.e., w0 or w1, respectively). Furthermore, a read operation can also include a read expected (r?), and read don't care (rx). In some embodiments, the read expected operation is used to manage the complexity of a test procedure which has a non-trivial expected read value. When the read expected operation is specified, embodiments of the present invention can compute an expected data value for the read expected operation. The rx operation can be used to enable some concurrent CFs by performing simultaneous read operations (or simultaneous read-write operations), such that the operation does not require a specific expected read value.

A test element can also include an inversion rule <cib, rib>, where cib and rib can have a logic one value or a logic zero value. Note that a logic one value for cib (rib) specifies that the read or write value for the memory access operation is to be inverted for alternating columns (rows) of the memory device. Therefore, an inversion rule <1,0> specifies that a column strip background is to be used by the test procedure, and an inversion rule <0,1> specifies that a row strip background is to be used by the test procedure. Furthermore, an inversion rule <1,1> specifies that a checkerboard background is to be used by the test procedure, and an inversion rule <0,0> specifies that no inversion background is to be used by the test procedure. Note that the inversion rule is optional for a test element. Therefore, when an inversion rule is not specified by a test element, the values for cib and rib are assumed to be logic zero.

TABLE 1 presents a number of exemplary test procedures for realistic faults in accordance with an embodiment. Rows 2 and 3 present test procedures for realistic cell array faults, and rows 4 and 5 present test procedures for realistic inter-port faults.

TABLE 1

| Test Procedure | Name | Detected Faults |
|---|---|---|
| { ⇕:[0,0](w0:n);⇑:[0,0](r0:r0, r0:rx, w1:r0);⇑:[0,0] (r1:r1, r1:rx, w0:r1); ⇓:[0,0](r0:r0, r0:rx, w1:r0); ⇓:[0,0](r1:r1, r1:rx, w0:r1); ⇓:[0,0](r0:n)} | s2pf-([13]) | TF combined with RDF, Combinations of Disturb CF, RDF combined with Read Destructive CF |
| {⇕:[0,0](w0:n); ⇑x:[0,1](w1:r0, r1:w1, w0:r1, r0:w0); ⇑x:[1,0](w1:r0, r1:w1, w0:r1, r0:w0); } | d2pf-([13]) | Disturb CF combined with: Read Destructive Faults, Random Read Faults, and incorrect read faults |
| {⇕:[0,0] <0,1>(w1:n); ⇑:[0,1](w0 :w1, r0:r1)} | — ([15]) | Bit-line shorts in same column |
| {⇑:[0,1] (n:w0, w0:w1, n:r0 )} | — ([15]) | Bit-line shorts in adjacent columns |

Realistic Concurrent and Complex CF and their Test Procedures

A set of realistic fault models (i.e., fault models with a high probability of occurring on a memory device) can be determined by a systematic analysis of representative samples of defective memory devices, or by an inductive fault analysis (IFA) technique that identifies and characterizes all faults from the layout of the memory device, and performs electrical simulations to compile a set of fault models which are realistic fault models (i.e., have an occurrence probability greater than a predetermined level). However, this approach for determining realistic fault models is dependent on the set of analyzed samples (e.g., the size of the sample set, their design, and the fabrication technology). Furthermore, this approach is also dependent on the size and distribution of the injected spot defects, and on their corresponding electrical modeling.

In some embodiments, a realistic set of fault models is determined for a multi-port memory device by restricting the set of fault models to those fault models that can occur in practice on a given memory design and/or fabrication process. This fault analysis can be achieved by analyzing the fault models at a high level of abstraction as described in the following paragraph.

In some embodiments, a test procedure for a multi-port memory device accounts for perturbations related to simultaneous memory access operations via two ports of the memory device.

Note that each of these perturbations can be caused by a defect in the memory device. Although possible, a double-defect situation has a very low occurrence probability, and is usually considered for applications which require a very high reliability. Therefore, in some embodiments, the system accounts for perturbations related to simultaneous operations performed from the two ports of the RAM, such that at most one perturbation is induced by a defect (i.e., a second perturbation is associated with a correct operation of the memory device). The test procedure for the multi-port memory device can be generated by analyzing the design of the memory device to determine a set of memory test operations that can cause worst-case electrical behavior for a memory cell. Then these memory test operations for activating single defects can be combined to generate tests for detecting realistic Concurrent and Duplex CFs.

In some embodiments, the test procedure does not account for the possibility that two faults can occur on a memory device, because two defects have a low probability of occurring simultaneously on a circuit. In other embodiments, a test procedure can be generated for a memory device which has a high reliability expectation, by generating the test procedure to account for a possibility that two or more faults (which result from two or more defects) can occur in the memory device.

In some embodiments, a concurrent CF affects two cells: a coupled cell, $C_i$, and a coupling cell, $C_j$. Therefore, to activate the concurrent CF, a memory access operation is performed on a first port of the memory device to access the coupled cell, and a second memory access operation is performed simultaneously on a second port to access the coupling cell. Furthermore, to detect the concurrent CF, two defect types have to be considered.

In a first defect type, the defect affects the coupled cell alone, or it affects the read/write amplifiers of the coupled cell. In some occasions, a critical electrical condition can occur when both the coupled and the coupling cells are selected by the same word lines, which can cause the capacitance on the coupled cells to double. This can cause the read and write operations on the second port to have the same effect on the coupled cell (i.e., the memory access operation connects the coupled cell to the pre-charge bit lines of the second port). The memory access operation on the first port, on the other hand, has to be performed for both the read and write operations because the two memory access operations can activate unique faults (e.g., faults from defects that affect the read amplifiers or the write amplifiers). Furthermore, the read and the write memory access operations on the first port are performed for both the logic zero and the logic one value to detect further defect variations (e.g., a defect can make a memory cell or the amplifiers asymmetric, thereby affecting the memory cell for a logic zero value, or a logic one value).

For a write operation, a critical electrical condition can occur when a write operation alters the state of a memory cell (i.e., the state transitions from a logic zero to a logic one value, or from a logic one to a logic zero). During such transition, the previous state of the cell involves an electrical current which can resist to the state transition. Furthermore, the defect can be asymmetric, such that it can affect only the paths associated with a first port or a second port of the memory device. Therefore, to detect a fault in the memory device which is caused by a state transition of a memory cell, a memory access operation is performed via two ports of the multi-port memory device to activate the fault.

TABLE 2 presents a number of conditions for activating a realistic concurrent coupling fault in accordance with an embodiment. Note that Op2 can correspond to any possible memory access operation. The conditions for activing the realistic concurrent coupling fault are presented in columns 1 and 2, and a first compacted set of memory access operations which can activate the realistic concurrent coupling fault are presented in columns 3 and 4. Furthermore, an alternate set of memory access operations for activating the realistic concurrent coupling fault are presented in columns 5 and 6.

A realistic concurrent march (RCM1) test procedure which can satisfy the four conditions from the first or second compacted set of memory access operations is provided as follows:

{⇕:[1,0](w0:n); ⇑:[1,0](w1:r0); ⇑:[1,0](w0:r1); ⇑:[1,0](n:r0, r0:w1); ⇑:[1,0](r1:w0); ⇑:[1,0](r0:n)}.

In a second defect type, the defect can create an interaction between the coupled cell and a neighboring cell (i.e., the coupling cell). The interaction between the coupled cell and the coupling cell can be static or dynamic. During a static interaction, the coupled cell is affected under a particular state of the coupling cell (e.g., a bridging fault), in which case it does not involve a concurrent CF. During a dynamic interaction, a memory access operation on the coupling cell can affect the coupled cell (e.g., capacitive coupling between the cells). Note that the coupled cell and the coupling cell can interact if the two cells belong to the same row on consecutives columns or to consecutives rows on the same column (i.e., they are neighboring cells). Furthermore, capacitive coupling can affect the memory device when the operation on the coupling cell alters the state of the coupling cell (i.e., the stored value of the coupling cell experiences a state transition).

In some embodiments, the memory access operation on the coupled cell can be a read or a write operation. Furthermore, some read operations are performed with an expected logic zero value, and others are performed with an expected logic one value. The critical electrical conditions associated with a write operation correspond to write operations which alter the state of a memory cell.

TABLE 2

| Possible cases | | Compacted cases (v1) | | Compacted cases (v2) | |
|---|---|---|---|---|---|
| Port 1 | Port 2 | Port 1 | Port 2 | Port 1 | Port 2 |
| W0→1 | Op2 | W0→1 | W0→1 | W0→1 | R0 |
| W1→0 | Op2 | W1→0 | W1→0 | W1→0 | R1 |
| R0 | Op2 | R0 | R0 | R0 | W0→1 |
| R1 | Op2 | R1 | R1 | R1 | W1→0 |
| Op2 | W0→1 | | | | |
| Op2 | W1→0 | | | | |
| Op2 | R0 | | | | |
| Op2 | R1 | | | | |

TABLE 3 presents a compacted set of conditions which can detect a fault between neighboring cells in accordance with an embodiment. Note that the memory access operations are performed on two cells which belong to the same row on consecutives columns or to consecutives rows on the same column (i.e., they are neighboring cells). Test procedure RCM1 can cover half of the cases on columns 1 and 2, when the coupling and coupled cells belong to the same row and consecutive columns. The other half of the conditions on columns 1 and 2 can be covered by a test procedure RCM2a:

{⇕:[1,0]<1,0>(w0:n); ⇑:[1,0]<1,0>(w1:r1); ⇑:[1,0]<1,0> (w0:r0); ⇑:[1,0]<1,0> (n:r1, r0:w0); ⇑:[1,0] <1,0>(r1:w1); ⇑:[1,0]<1,0> (r0:n)}.

Test procedure RCM2a performs a column strip initialization, (i.e., a column stores a single repeating value, while the rows are initialized to store an alternating bit sequence). When the coupling and coupled cells belong to consecutive rows, test procedures RCM1 and RCM2b are repeated once again using a column offset of 0, and a row offset of 1, while using a row strip background (i.e., a row stores a single repeating value, while the columns are initialized to store an alternating bit sequence).

The conditions presented in columns 3 and 4 can be covered by a test procedure RCM2b (i.e., when the coupling and coupled cells belong to the same row):

{⇕:[1,0]<0,0> (w0:n); ⇑:[1,0]<0,0>(w1:w1, r1:r1, w0:w0, r0:r0); ⇕:[1,0]<1,0>(w0:n); ⇑:[1,0]<1,0> (w1:w0, r1:r0, w0:w1, r0:r1)}.

Note that the first half of test procedure RCM2b uses a solid 0 background, whereas the second half uses a column strip background.

Note that test procedure RCM2b can be used when the coupling and coupled cells belong to consecutive rows, by using a row offset instead of a column offset, and by using a row strip background for the third and fourth test elements.

TABLE 3

| Read op on coupled cell | | Write op on coupled cell | |
| --- | --- | --- | --- |
| Port 1 | Port 2 | Port 1 | Port 2 |
| R0 | W0→1 | W0→1 | W0→1 |
| R0 | W1→0 | W0→1 | W1→0 |
| R1 | W0→1 | W1→0 | W0→1 |
| R1 | W1→0 | W1→0 | W1→0 |
| W0→1 | R0 | | |
| W1→0 | R0 | | |
| W0→1 | R1 | | |
| W1→0 | R1 | | |

In some embodiments, a duplex CF has a coupled cell $C_k$ and two coupling cells $C_i$ and $C_j$, such that simultaneous memory access operations on cells $C_i$ and $C_j$ can modify the state of cell $C_k$. In realistic duplex CF, the involved faults are given by the following defect types:

In a first defect type, the defect affects the coupled cell alone. The double operation which creates the strongest perturbation on cell $C_k$ occurs when $C_i$ and $C_j$ belong to the same row as cell $C_k$. The combination of this perturbation with the presence of a defect on cell $C_k$ can activate the duplex CF. Note that any type of operation can be performed on the coupling cells to cause a perturbation, because both read and write operations connect cell $C_k$ to the pre-charged bit lines. Furthermore, the test should be performed to account for both logic states on coupled cell $C_k$ (i.e., expected values of logic zero and logic one).

In a second defect type, the defect can create a static interaction between cell $C_k$ and another cell $C_1$ (e.g., a bridging fault). A fault caused by the defect can be activated when cells $C_k$ and $C_1$ store a particular pair of values. Therefore, the test should be performed for all possible state pairs between cells $C_k$ and $C_1$. Note that a critical electrical condition can occur on cell $C_k$ when cells $C_i$ and $C_j$ are selected by the same word line as $C_k$.

In a third defect type, the defect can create a dynamic interaction between cells $C_k$ and $C_1$ (e.g., capacitive coupling). A fault caused by the defect can be activated when cell $C_k$ is in a particular state, and a particular memory access operation is performed on cell $C_1$ (e.g., a write operation which causes a state transition in cell $C_1$). Note that a first memory access operation is used to activate the fault, and a second memory access operation is used to activate the duplex CF. Furthermore, a critical electrical condition can occur on cell $C_k$ when a memory access operation is performed over a cell $C_j$ which belongs to the same row as $C_k$. The capacitive coupling between cells $C_k$ and $C_1$ implies that the two cells belong to the same row and consecutive columns, or the same column and consecutive rows.

TABLE 4 presents a number of conditions to test for a duplex coupling fault in accordance with an embodiment. The realistic duplex CF can correspond to any of the three defect types listed above. Note that op1 and op2 are performed on memory cells which are selected by the same word line as $C_k$, while a transition write is performed on cell $C_1$ (i.e., the third fault type) which belongs to the same row as $C_k$ and a neighboring column, or belongs to the same column as $C_k$ and a neighboring row.

A duplex CF of the first defect type can be covered by a test procedure RDM1:

{⇕[1,0](w0:n); ⇑:[1,0](r0:n, w1:r0); ⇑:[1,0](r1:n, w0:r1);

⇓:[1,0](n:r0, r0:w1); ⇓:[1,0](n:r1, r1:w0); ⇑:[1,0](r0:n)}.

TABLE 4

| Defect type 1 | Defect type 2 | Defect type 3 |
| --- | --- | --- |
| $C_k = 0$, op1, op2 | $C_k = 0, C_1 = 0$, op1, op2 | $C_k = 0, C_1 = 0 \to 1$, op2 |
| $C_k = 1$, op1, op2 | $C_k = 0, C_1 = 1$, op1, op2 | $C_k = 0, C_1 = 1 \to 0$, op2 |
| | $C_k = 1, C_1 = 0$, op1, op2 | $C_k = 1, C_1 = 0 \to 1$, op2 |
| | $C_k = 1, C_1 = 1$, op1, op2 | $C_k = 1, C_1 = 1 \to 0$, op2 |

Note that test procedure RDM 1 is similar to test procedure RCM1, except that test procedure RDM1 begins with a read operation, and test elements 4 and 5 of test procedure RDM1 have an inverted addressing order. Also, RDM1 can detect half of the type 2 defects. The other half of the type 2 defects can be detected by executing test procedure RDM1 using a row strip background. Similarly for the type 3 defects, RDM1 can be used to detect half of the type 3 faults (when the $C_1$ belongs to the same row as $C_k$), and the other half can be detected by repeating RDM1 using a column strip background.

A duplex DF of the third defect type, when the $C_1$ and $C_k$ belong to consecutive rows, can be detected using a test procedure RDM3:

{⇕:[0,1](w0:n); ⇑:[0,1](r0:n, w1:r0); ⇑:[0,1](r1:n, w0:r1);

⇑:[0,1](n:r0, r0:w1); ⇑:[0,1](n:r1, r1:w0); ⇑:[0,1](r0:n),

⇕:[0,1]<0,1>(w0:n); ⇑:[0,1]<0,1>(r1:n, w0:r0); ⇑:[0,1]<0,

1>(r0:n, w1:r1); ⇑:[0,1]<0,1>(n:r0, r1:w1);

⇑:[0,1]<0,1>(n:r1, r0:w); ⇑:[0,1]<0,1>(r1:n)}.

Note that test procedures RCM1, RCM2a, and RCM2b can be used to detect realistic concurrent coupling faults, and test procedures RDM1, RDM2, and RDM3 can be used to detect realistic duplex coupling faults. A fault which causes a capacitive coupling has the lowest occurrence probability, while a fault which affects a single cell has the highest occurrence probability. In some embodiments, when only single-cell faults are considered (i.e., concurrent CF of type 1 and duplex CF of type 1), the test procedure RDM1 can be used to achieve the highest fault coverage with a minimum test length. When all concurrent CFs are considered, test procedure RCM1 can be combined with test procedures RCM2a and RCM2b (both applied twice, the second time for consecutive rows and row strip background) to achieve an optimal fault coverage. Furthermore, if all duplex CF types are considered, then test procedure RDM1 (performed 3 times, the last two using row strip and column strip backgrounds) and test procedure RDM3 can be combined to achieve an optimal fault coverage. Even for these worst-case conditions (i.e., considering all fault types), the complexity of the test procedures is significantly smaller than a typical topological test procedure (i.e., a complexity of 50N against 456N, for a test length N).

The Programmable BIST Architecture

Referring back to FIG. 3, memory tester 300 implements a programmable BIST (PBIST) architecture which can provide support for test procedures that cover fault models that are specific to multi-port memory devices, while ensuring a cost-effective implementation. Furthermore, the PBIST architecture can also provide support for existing test procedures for realistic fault models, functional fault models, and SP-RAM tests.

TABLE 5 presents a number of fields associated with a test instruction for a memory tester in accordance with an embodiment. Note that the rows within a bold border represent new and modified instruction fields.

The Port Mode and Test Mode fields (i.e., PP and TM fields) can be used to specify whether memory tester 300 operates in a preset mode of operation. The PP and TM fields affect both ports of memory tester 300. The field Pause (for Retention test) is also common for both ports, and indicates whether the BIST will pause until its reactivation through a dedicated signal.

The address for port 2 is relative to the port 1 address, such that it has the same addressing sense, and the same direction. Therefore, the AM and AS bits correspond to both ports of memory tester 300. In addition, the address control fields are augmented with column offset (CO) and row offset (RO) bits. The CO and RO bits specify, for the port 2 address of memory tester 300, an offset from the port 1 column address and row address, respectively.

The NBOPS field is also common to both ports, and specifies the number of operations of the DP-RAM test sequence. When an SP-RAM test is used, the NBOPS field specifies the operations of the active port. Each operation field is composed of three bits; the first two bits specify its mode (i.e., read, write, read don't care, and no operation), and the third bit indicates the data polarity of that operation. In some embodiments, when the third bit is set to 1, the test data is inverted.

In some embodiments, a background pattern can be specified for a test sequence by the CBI and RBI bits. That is, a column background pattern can be specified by setting CBI to 1, and setting RBI to 0. A row background pattern can be specified by setting CBI to 0, and setting RBI to 1. Furthermore, a checkerboard background pattern can be specified by setting both CBI and RBI to 1.

The 1ID and 2ID fields can be used to correctly handle irregular data when performing a test sequence. That is, when the irregular data bit 1ID is set, irregular data is not expected or written for port 1 of a multi-port memory device. Similarly, when the irregular data bit 2ID is set, irregular data is not expected or written for port 2 of the multi-port memory device.

TABLE 5

Programmable BIST Codeword

| Fields | Size | Descriptione |
|---|---|---|
| ET | 1 | End Test (i.e., current sequence is last one) |
| PP | 2 | Port Mode, used with the preset-mode |
| TM | N | Test Mode, used with the preset-mode |
| PS | 1 | Pause mode (for iddq and retention test) |
| AM | 1 | The address scheme (fast x, fast y) |
| AS | 1 | Up/Down address direction |
| CO | 1 | Port 2 column address offset |
| RO | 1 | Port 2 row address offset |
| CBI | 1 | Column Background Inversion |
| RBI | 1 | Row Background Inversion |
| 1ID | 1 | Port 1 Irregular |
| 2ID | 1 | Port 2 Irregular |
| NBOPS | K | Ops number of the current test sequence. |
| O1.O2 ... O1 O2 | 6 * 2K | Port 1 ops followed by port 2 ops |
| TD* | W | Test Data (W is test data width) |

In some embodiments, scan register 302 and instruction register 308 manage the load and storage of an instruction set. Furthermore, sequence-and-data generator 312 specifies an instruction (operation and data) to be executed based on the instructions stored in instruction register 308.

Address generator 318 generates a memory address for two ports of a multi-port memory device. Furthermore, address generator 318 generates a memory address by computing the column address and row address separately. The two-dimensional address implementation (i.e., separate row and column address modules) can facilitate the derivation of the fast x and fast y addressing mode, and can facilitate computing the row and column addresses for the second port based in part on the row and column offsets. These modes are selected using the CO and RO address mode control bits, and can be performed as follows (assuming that there are m row addresses and k column addresses, and assuming that $RA_1$, $RA_2$, $CA_1$ and $CA_2$ are row and column addresses for port 1 and port 2, respectively):

Address Mode 0: $RA_2=RA_1$ and $CA_2=CA_1$. The initial values are $RA_1=0$, $RA_2=0$, $CA_1=0$, $CA_2=0$. $RA_1$, $RA_2$, $CA_1$, and $CA_2$ increment at the same time following a given addressing mode (fast x, fast y).

Address Mode 1: The row addresses are equal ($RA_1=RA_2$), and the column address of port 2 is one value higher than the column address of port 1 ($CA_2=CA_1+1$). $CA_1$ increments from 0 to k over a number of test operations, while $CA_2$ increments from 1 to k and then jumps to 0. After $CA_1$ and $CA_2$ have completed a cycle, $RA_1$ and $RA_2$ are incremented (fast x). To enable incrementing $RA_1$ and $RA_2$, a comparison operation can be performed to determine whether $CA_1$ holds the value k, or to determine whether $CA_2$ holds the value 0. To enable decrementing $RA_1$ and $RA_2$ for the down-addressing order of this scheme, a comparison operation can be performed to determine whether $CA_1$ holds the value 0, and $CA_2$ holds the value k. Furthermore, $CA_1$ has an initial value k, and $CA_2$ has an initial value 0.

Address Mode 2: $RA_2=RA_1+1$, $CA_2=CA_1$. The initial values are $RA_1=0$, $RA_{2=1}$, $CA_2=CA_1=0$. $CA_1$ and $CA_2$ increment from 0 to k over a number of test operations. When $CA_1$ and $CA_2$ have completed one cycle, $RA_1$ and $RA_2$ are incremented. To enable incrementing $RA_1$ and $RA_2$, a comparison operation can be performed to determine whether $CA_1$ and $CA_2$ both hold a value k. To enable decrementing $RA_1$ and $RA_2$ for the down-addressing order, a comparison operation can be performed to determine whether $CA_1$ and $CA_2$ hold a value 0.

Address Mode 3: $RA_2=RA_1+1$, $CA_2=CA_1+1$. The initial values are $RA_1=0$, $RA_2=1$, $CA_1=0$, $CA_2=1$. $CA_1$ increments from 0 to k over a number of test operations, while $CA_2$ increments from 1 to k and then jumps to 0. Once $CA_1$ and $CA_2$ have completed one cycle, $RA_1$ and $RA_2$ increment once. $RA_1$ increments from 0 to k, and $RA_2$ increments from 1 to k and then jumps to 0. To enable incrementing $RA_1$ and $RA_2$, a comparison operation can be performed to determine whether $CA_1$ holds a value k, and to determine whether $CA_2$ holds a value 0. To enable decrementing $RA_1$ and $RA_2$ for the down-addressing order, a comparison operation can be performed to determine whether $CA_1$ holds a value 0, and to determine whether $CA_2$ holds a value k.

In some embodiments, memory tester 300 can facilitate testing a variety of DP-RAM and register file designs. More specifically, memory tester 300 can facilitate testing a dual-port static RAM device which implements any two-port combination, including: 2 read/write ports (2RW); 1 read/write and 1 read-only port (1RW, 1RO); 1 read/write and 1 write-only port (1RW, 1WO); 1 write-only and 1 read-only port (1WO, 1RO); and a DP-RAM which can perform simultaneous read and/or simultaneous read-write to one memory location. In some variations on these embodiments, data written in one clock cycle can be read in the same clock cycle. In other variations, when a write operation is performed, the read of the previous data (cycle prior to the write) is allowed. In further variations, when a write operation is performed, the read data is discarded (write op has the higher priority). In even further embodiments, the DP-RAM can allow different clock frequencies for each port. In some embodiments, memory tester 300 supports a DP-RAM which allows different clock frequencies for each port, by performing a test sequence at the lowest functional frequency. Note that memory tester 300 can be used to test a multi-port memory device with more than two memory ports.

In some embodiments, memory tester 300 allows for a full programmable BIST mode (i.e., shift mode), where an instruction set which implements a full test sequence can be shifted into scan register 302 via a serial input signal 330, using the automated test equipment (ATE) clock signal. Furthermore, an instruction from scan register 302 can be shifted into instruction register 308 as a vector, using the at-speed system clock in an uninterrupted manner. Note that the scan register 302 can load a subsequent instruction so that it is ready to be loaded by the instruction register 308 at the completion of the current test sequence.

In some embodiments, memory tester 300 allows for a preset test mode. Preset-test-procedure generator 304 can be configured to generate one or more predefined memory test sequences (i.e., for a fabrication test). A test instruction comprises two fields which allow for a minimum control of the preset-mode without impacting the pin-count. The Port Mode field specifies whether the current SP test is applied to port 1, port 2, or sequentially to both ports. Furthermore, the Test Mode field allows selecting the preset test procedure when there is more than one embedded test procedure.

Note that the number of preset test procedures should be kept relatively low to ensure a good tradeoff between BIST control and area overhead. A minimum preset test set can be achieved by incorporating well-proven and general purpose test procedures into preset-test-procedure generator 304, and providing any specialized test procedures (e.g., specific to a given memory type and/or a given memory operating mode) to scan register 302 at runtime through instruction input 330.

Managing Test Data Irregularities

In some embodiments of the present invention, a test instruction can specify an expected data value for a read operation. Therefore, whenever a memory tester performs the read operation, the memory tester can compare the expected data value to the actual value which results from the read operation. If the two data values match, then the memory tester determines that a fault is not present on a memory cell which corresponds to the read operation. However, if the two data values do not match, then the memory tester determines that a fault is present on the corresponding memory cell.

In some embodiments of the present invention, a test instruction can specify two simultaneous memory access operations to be performed on a memory device, such that the expected data value corresponds to a typical memory access operation. However, during a specific iteration of a test sequence, the data value which is read from a memory cell does not match the expected data value during normal operating conditions of the memory device. This discrepancy between the expected data value and the actual data value is due to a data irregularity of a test sequence. A data irregularity can occur for a test operation when one iteration of the test operation performs a memory read on a memory cell through a first port whose state was altered by a previous iteration of the same test operation through a second port.

Figure 7A:
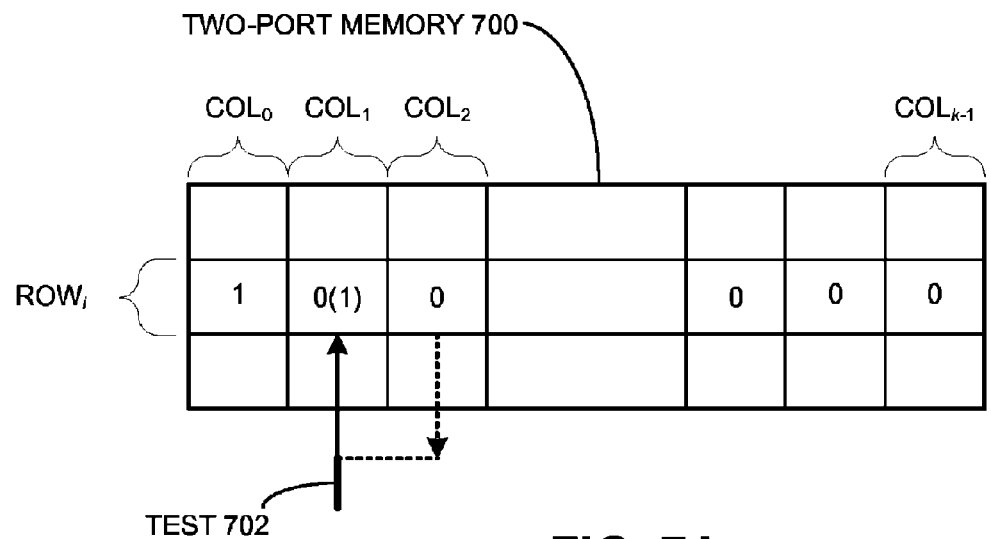
FIG. 7A illustrates a regular memory read for a test operation in accordance with an embodiment.

FIG. 7A illustrates a regular memory read for a test operation in accordance with an embodiment. More specifically, a memory test procedure $\{\Uparrow:[0,0]\ (w0:n); \Uparrow:[1,0]\ (w1:r0)\}$ is performed on row i of two-port memory 700 using addressing mode 1 (i.e., $RA_2=RA_1$, $CA_2=CA_1+1$). Note that the first test sequence initializes the memory cells for row i of two-port memory 700 to have an initial logic value 0. Therefore, when the second test sequence 702 (i.e., $\{\Uparrow:[1,0]\ (w1:r0)\}$) is performed on columns 1 and 2 of two-port memory 700, the read operation on column 2 returns the expected logic value 0. Note that a write operation is being performed on column 1 (illustrated in FIG. 7A in parentheses), which alters the state of the memory cell from a logic 0 to a logic 1 value. Furthermore, note that a memory write operation is illustrated using a solid arrow, and a memory read operation is illustrated using a dashed arrow.

Figure 7B:
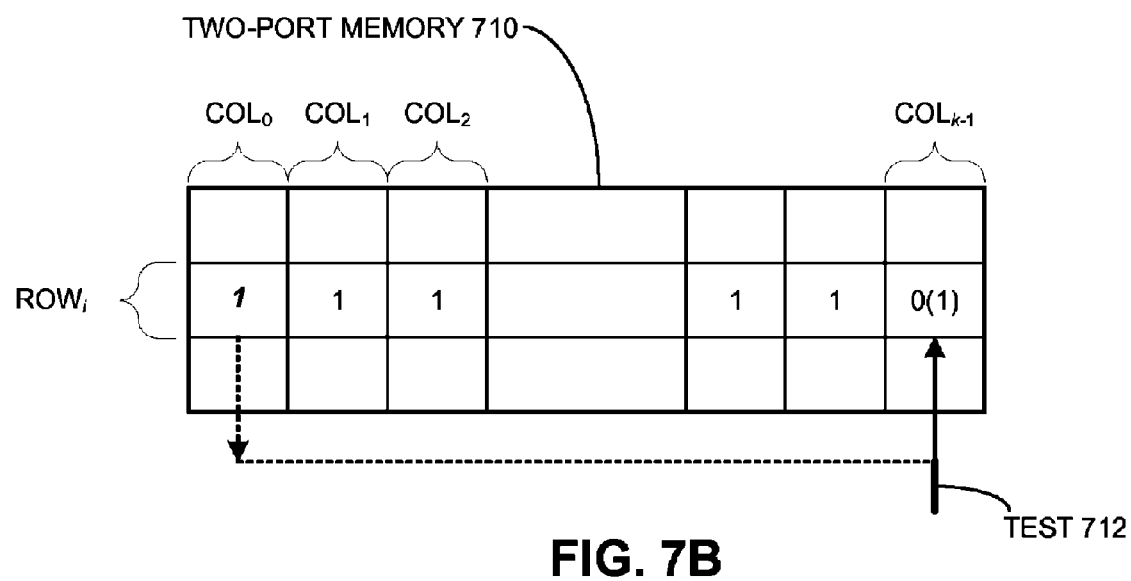
FIG. 7B illustrates an irregular memory read for a test operation in accordance with an embodiment.

FIG. 7B illustrates an irregular memory read for a test operation in accordance with an embodiment. More specifically, when a test sequence 712 (i.e., $\{\Uparrow:[1,0]\ (w1:r0)\}$) is performed on columns k-1 and 0 of two-port memory 710, the read operation on column 0 returns an unexpected logic value 1, which does not match the expected value 0 specified by the test operation. This irregular data is caused by the first write operation that was performed on column 0 by the first iteration of the test operation.

Figure 7C:
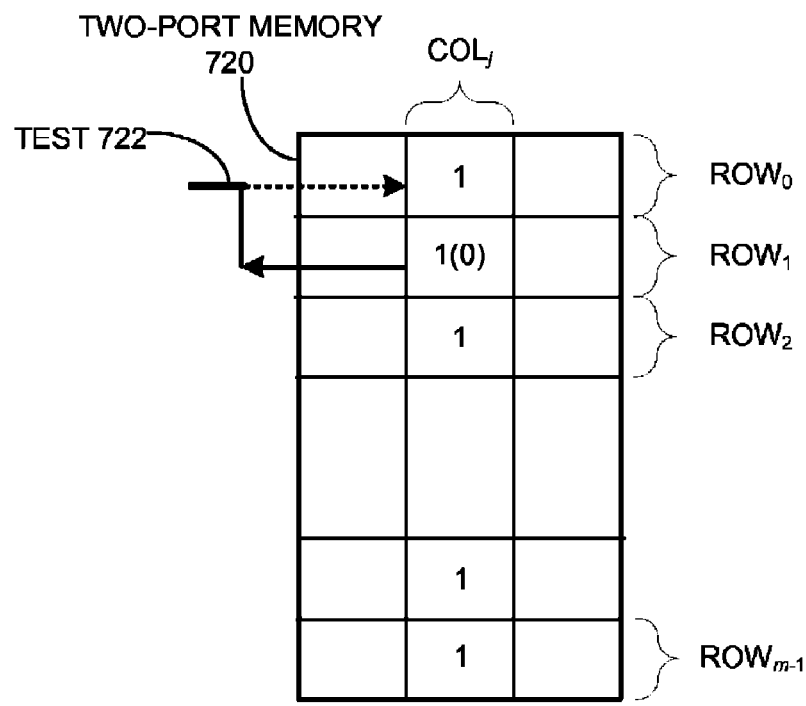
FIG. 7C illustrates a regular memory read for a test operation in accordance with an embodiment.

FIG. 7C illustrates a regular memory read for a test operation in accordance with an embodiment. More specifically, a memory test sequence 722 $\{\Uparrow:[0,0]\ (w1:n); \Uparrow:[0,1]\ (r1:w0)\}$ is performed on column j of two-port memory 720 using addressing mode 2 (i.e., $RA_2=RA_1+1$, $CA_2=CA_1$). Note that the first test sequence (i.e., $\{\Uparrow:[0,0]\ (w1:n)\};$) initializes the memory cells for column j of two-port memory 720 to have an initial logic value 1. Therefore, when the second test operation (i.e., $\{\Uparrow:[0,1]\ (r1:w0)\}$) is performed on rows 0 and 1 of two-port memory 720, the read operation on row 0 returns the expected logic value 1. Note that a write operation is being performed on row 1 (illustrated in FIG. 7C in parentheses), which alters the state of the memory cell from a logic 1 to a logic 0 value. Furthermore, note that a memory write operation is illustrated using a solid arrow, and a memory read operation is illustrated using a dashed arrow.

Figure 7D:
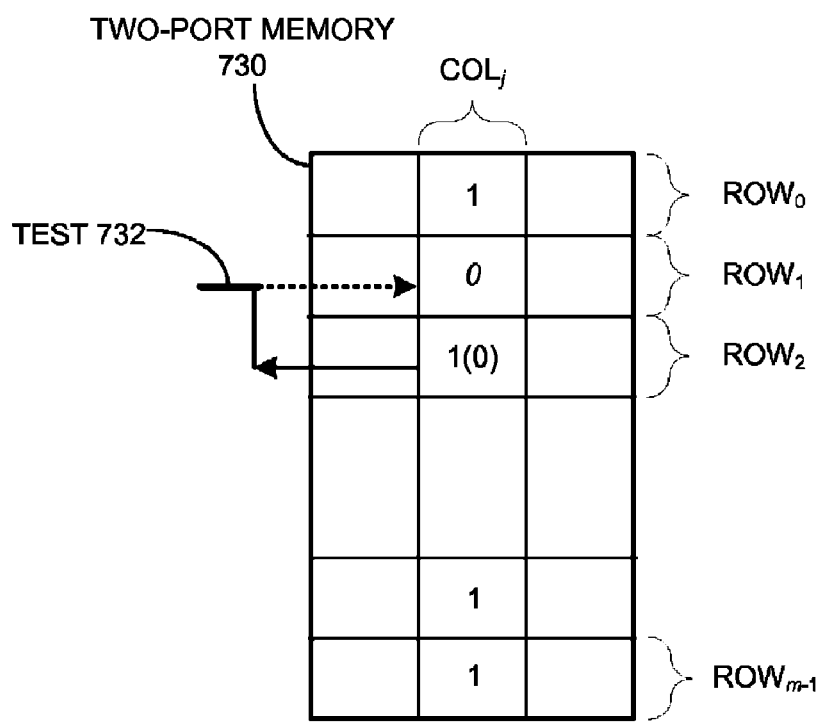
FIG. 7D illustrates an irregular memory read for a test operation in accordance with an embodiment.

FIG. 7D illustrates an irregular memory read for a test operation in accordance with an embodiment. More specifically, when a test sequence 732 (i.e., $\{\Uparrow:[0,1]\ (r1:w0)\}$) is performed on rows 1 and 2 of two-port memory 730, the read operation on row 1 returns an unexpected logic value 0, which does not match the expected value 1 specified by the test operation. This irregular data is caused by the first write operation that was performed on row 0 by the first iteration of the test sequence. Note that in this case, all read operations performed on cells from row 1 to row m−1 will return irregular data values.

In some embodiments, test data irregularities can be handled by an irregular data controller, which can be implemented in a hardware module. The irregular data controller can invert the read and write data specified by a test procedure to match an irregular data that is experienced during a test operation. To do so, the irregular data controller can generate, for each port of a multi-port memory device, an irregular control signal (i.e., IR signal) which specifies when the corresponding read/write data needs to be inverted. The irregular data controller can generate the IR signal by combining the irregular data bits 1ID and 2ID with the address mode bits CO and RO, and with two bits which indicate the 0 column address and the 0 row address.

In some embodiments, a software module executing within a computing device can be implemented by a set of instructions, stored in a computer-readable storage medium of the computing device, which when executed by a processor of the computing device, can cause the computing device to monitor the memory access operations performed on the set of ports of the multi-port memory device. More specifically, the software module can configure the computing device to analyze a write operation on a port of the memory device, and compare the polarities of all write operations of that test sequence to determine whether an odd or an even number of inverting write operations have been performed on the port. Furthermore, the software module can cause the computing device to set an irregular data bit (e.g., the 1ID bit for a port 1, or the 2ID bit for a port 2) in the instruction register to hold a logic 1 value when a test sequence performs an odd number of inverting writes on a corresponding port of the memory device.

In some embodiments, when the irregular data bit of one port is set to a logic 1 value, the read data value received from the other port is inverted as follows:

Address mode 1: If the irregular data bit of port 1 (bit 1ID) is set to a logic 1 value, and an up-addressing order is employed, a data value associated with port 2 is inverted when the column address of port 2 is equal to column address 0. Conversely, for a down-addressing order, a data value associated with port 2 is inverted when the column address for port 2 is not equal to column address 0 (i.e., inversions performed on all but the first cycle of the sequence). If the irregular data bit of port 2 (bit 2ID) is set to a logic 1 value, and an up-addressing order is employed, a data value associated with port 1 is inverted when the column address of port 1 is not equal to column address 0. Conversely, for a down-addressing sequence, a data value associated with port 2 is inverted when the column address for port 2 is equal to column address 0.

Address modes 2 and 3: If the irregular data bit of port 1 (bit 1ID) is set to a logic 1 value, and an up-addressing order is employed, a data value associated with port 2 is inverted when the row address of port 2 is equal to row address 0. Conversely, for a down-addressing order, a data value associated with port 2 is inverted when the row address for port 2 is not equal to row address 0 (i.e., inversions performed on all but the first cycle of the sequence). If the irregular data bit of port 2 (bit 2ID) is set to a logic 1 value, and an up-addressing order is employed, a data value associated with port 1 is inverted when the row address of port 1 is not equal to row address 0. Conversely, for a down-addressing order, a data value associated with port 2 is inverted when the row address for port 2 is equal to row address 0.

Address mode 0: Data values associated with port 1 or port 2 are not inverted throughout the test sequence.

In some embodiments, a data inversion performed during a test sequence to manage test data irregularities can be undone to account for a data background for the test sequence. More specifically, a sequence-and-data generator can perform an inverting operation on a data value associated with a memory access operation to account for a data background, which can nullify an inversion performed on the data value to account for an irregular data pattern. For example, when a column strip background and an address mode 1 are employed, the data received from port 1 is inverted for half of the memory access operations (i.e., for even column addresses, when the irregular data bit of port 2 (bit 2ID) is asserted high and when port 1 column address is different than 0).

In some embodiments, the methods and apparatus for managing irregular test data can provide a memory tester with the flexibility to support a variety of test procedures, thereby allowing for a high test quality. For example, the following special cases can be supported by a memory tester in accordance with some embodiments: (a) a test sequence can write to port 1 but not to port 2 in some cycles, and can write to port 2 and not to port 1 in other cycles; (b) a test sequence can write to both ports in some cycles and to no ports in other cycles; (c) a test sequence can write to both ports throughout the test sequence, such that one port performs an inverting write operation, and the other port does not perform an inverting write opration; and (d) a test sequence can write to both ports throughout the test sequence, such that the number of inverting writes on either port is odd.

Bit-stream Generation

Figure 8:
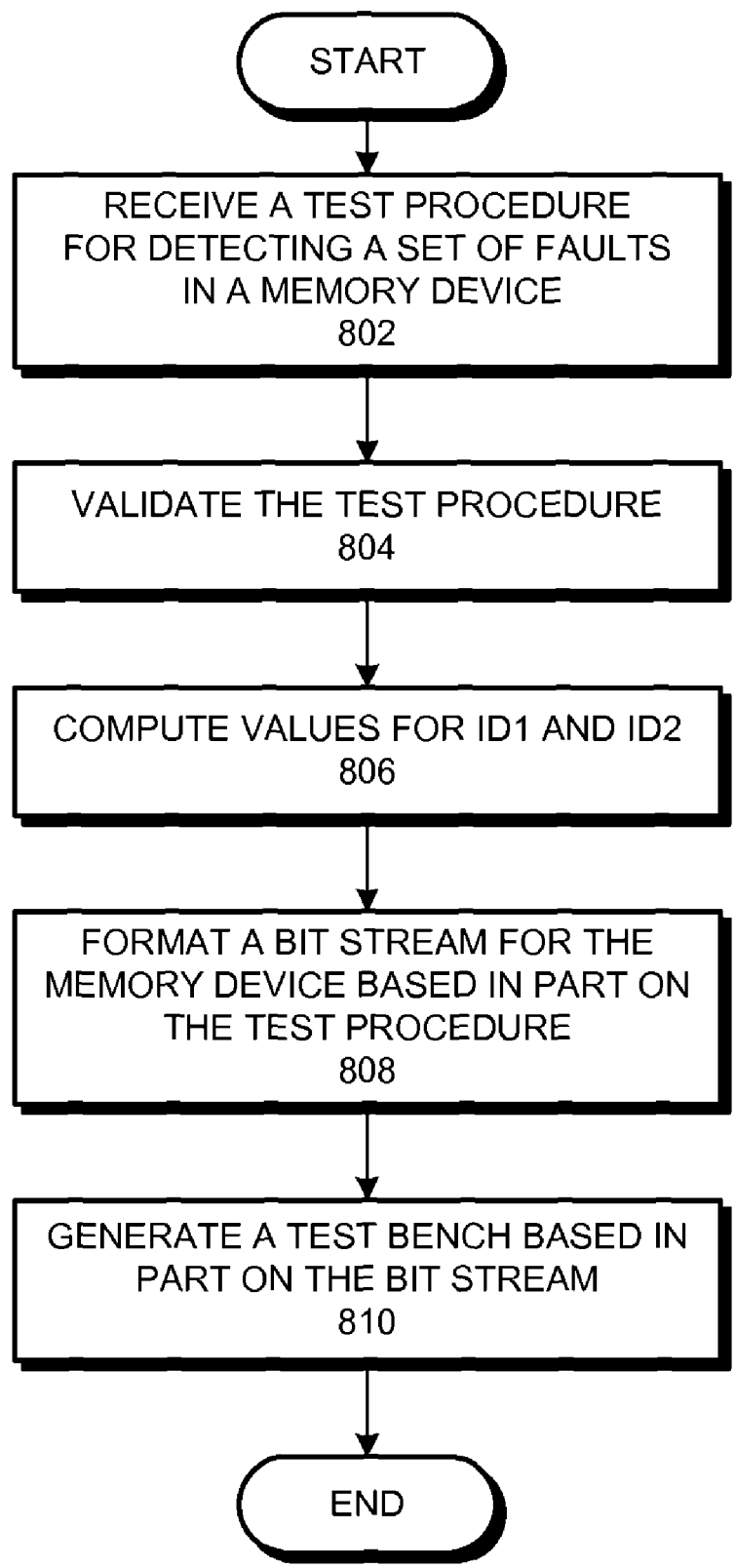
FIG. 8 presents a flowchart illustrating a process for generating a bit stream and a test bench for a test procedure in accordance with an embodiment.

FIG. 8 presents a flowchart illustrating a process for generating a bit stream and a test bench for a test procedure in accordance with an embodiment. In some embodiments, the process can be performed by a computer system which can configure an ATE for testing a multi-port memory device. The system can begin by receiving a test procedure for detecting a set of multi-port memory faults in a memory device (operation 802). Then, the system validates the test procedure (operation 804), and computes values for ID1 and ID2 (operation 806). Next, the system formats a bit stream for the memory device based in part on the test procedure (operation 808). In some embodiments, the bit stream can include a sequence of instructions which implement the test procedure. The system then generates a test bench based in part on the bit stream (operation 810).

In some embodiments, operation 804 can check the validity and compliance of a test procedure with a memory device under test. It can reject any test procedure which satisfies one or more of the following restrictions:

a) Two write operations are performed on the same address via both ports.

b) A read and a write operation are performed on the same address of a memory device which does not support this simultaneous operation.

c) An expected data value D is specified for a read operation on a first port when a preceding write operation is associated with a data value $\overline{D}$, and:

The preceding write data value is equal to the simultaneous write operation on a second port, when the memory device supports a simultaneous read and write capability. Depending on the specification for the memory device, the read data value can return either the previous data value, or the data value from the write operation.

If the memory device does not support a simultaneous read and write capability, two possible cases need to be considered. When there is no address offset between the two ports (either from the column address or the row address), the preceding write data value is the data of the last write operation, either on port 1 or port 2, in the current sequence or in a nearest preceding sequence. Conversely, when there is an offset (either on a column address or a row address), the preceding write data corresponds to the data of the last write operation on port 1 or port 2 when a write operation was only performed on one port, or corresponds to the data of the last write operation on port 1 when both ports performed a write operation.

In some embodiments, operation 804 can also determine an expected data value which corresponds to a wildcard symbol in a test procedure. Note that a wildcard symbol can be specified in place of an expected read data value (i.e., a 'r?' operation) when describing a test procedure, thereby simplifying the effort required to generate a test procedure. Furthermore, note that the wildcard symbol is not coded into a test intruction. The following section describes a method for determining an expected read data value for a wildcard symbol, based in part on the address mode and specifications for the memory device.

In some embodiments, operation 806 can determine values for ID1 and ID2 bits based in part on the memory access operations and address modes specified by a test procedure.

In some embodiments, operation 808 can format a bit stream for the memory device which includes a sequence of instructions that are to be loaded into an instruction register of the memory tester. The bit stream can be generated by specifying the values for the set of fields of an instruction word, such that the field values satisfy the test procedure description. In doing so, two particular cases are considered and accounted for:

The irregular data bits 1ID and 2ID have to be properly set. The irregular data bit of port 1 (1ID) is to set to 1 in a test sequence when only port 1 performs write operations, and when there is an odd number of inverting write operations. Similarly, the irregular data bit of the port 2 (2ID) is set to 1 in the test sequence when only port 2 performs write operations, and when there is an odd number of inverting write operations.

For a test sequence which uses a down-addressing order and performs an odd number of inverting write operations on a first port, the data value of an operation in the bit stream is inverted for a read or write operation performed on the second port. Note that, by inverting a data value associated with a memory access operation, in the instruction stream as opposed to in the memory tester, the irregular data controller of a memory tester can handle irregular data patterns for a down-addressing order.

In some embodiments, operation 810 can generate a test bench for testing a multi-port memory device using a BIST memory tester, and can generate a standard test interface language (STIL) file which can configure an ATE to perform the test procedure.

Determining an Expected Read Value for a Wildcard Symbol

In some embodiments, the system determines an expected read data value for a wildcard symbol, based in part on the address mode and specifications for the memory device. In doing so, the system can determine the expected read data value when a test procedure performs memory access operations on different addresses per port of the memory device (i.e., address modes 1-3), or when the test procedure performs memory access operations on the same address per port of the memory device (i.e., address mode 0).

Test Procedures with a Port Address Offset (Address Modes 1, 2 and 3)

If the test procedure performs memory access operations on different addresses per port of the memory device, the system determines an expected read value for a wildcard symbol as follows.

The system can begin by analyzing the read operations performed on port 1 by the set of test sequences of a test procedure to determine their value. The system also analyzes the read operations performed on port 2 to determine their value. Then, when determining an expected data value for a wildcard symbol of a read operation performed on a port i (i∈{1,2}) in a cycle j of a test sequence, the system analyzes an operation performed on port i at a nearest cycle k(k<j) of the same test sequence to identify a preceding write operation on port i. The system then uses the data value for the identified write operation as the expected data value which replaces the wildcard symbol.

For example, the system can evaluate the test procedure {⇑:[0,1](w1:w0, r?:r?, w0:w1, r?:r?)}, and generate a deterministic test procedure {⇑:[0,1](w1:w0, r1:r0, w0:w1, r0:r1)}. Similarly, the system can evaluate the test procedure {⇑:[0,1](w1:r?, r?:r?)}, and generate a deterministic test procedure {⇑:[0,1](w1:r?, r1:r?)}.

If a test sequence does not perform a write operation on port i, for any cycle k<j, the system identifies a write operation performed on any port by a nearest preceding test sequence. The system then uses the data value for the identified write operation as the expected data value which replaces the wildcard symbol.

For example, consider the following test procedure: {⇑:[0,1](w0:n)]; ⇑:[0,1] (r?:n, w1:r?); ⇑:[0,1] (r?:n, w0:r?)}. The system first replaces the second test element with a deterministic test element {⇑:[0,1] (r0:n, w1:r0)}. Note that an expected data value is determined for the first wildcard symbol of the second test element (i.e., the read operation on port 1) based on the write operation from the first test element, given that this is the nearest preceding read operation on port 1. Similarly, the system replaces the third test element with a deterministic test element {⇑:[0,1] (r1:n, w0:r1)}.

Test Procedures with No Port Address Offset (Address Mode 0)

If the test procedure performs memory access operations on a single address per port of the memory device, the system determines an expected read value for a wildcard symbol as follows.

The system can begin by analyzing the types of simultaneous memory access operations performed by a test procedure. If the system determines that the test procedure intends to perform a write operation on both ports, the system rejects the test procedure. Therefore, the simultaneous memory access operations which are allowable include simultaneous read operations (i.e., read-read), and include simultaneous read and write operations (i.e., read-write, and write-read). Note that the read-read operation returns the same read value for both ports according to the last write operation made on one of the ports. Furthermore, the read-write or write-read operations depend on the specifications of the memory device under test.

In some embodiments, a wildcard symbol can be used to create a test procedure where an expected read value is dependent on the implementation of a memory device, thereby allowing the system to determine the appropriate expected value for a target memory device on a case-by-case basis. Let us consider the following test procedure:

{⇑:[0,0](w0:n); ⇑:[0,0](w1:r?); ⇑:[0,0](r1:r1); ⇑:[0,0](w0:r?)}. This test procedure specifies that the following sequence of operations are to be performed on a first port of a memory device: (w0); (w1); (r1); (w0).

However, a number of read operations specified for the second port include a wildcard symbol, which requires analyzing the test procedure to determine their corresponding expected data values.

In some embodiments, the system can analyze the test procedure by first removing the read operations performed from the first port, and then analyzing the remaining operations (i.e., the writes performed from the first port and the reads performed from the second port) as if they belong to a single port test procedure. In other words, the system sequences pairs of simultaneous memory access operations performed on both ports of a memory device under test. Note that, to determine the sequence of operations, the system first determines whether the memory device gives priority to a read operation or to a write operation when performing simultaneous read and write memory access operations.

If the memory device gives priority to a read operation (i.e., returns the value present in a memory cell for a read operation before performing a simultaneous write operation on the memory cell), then the system sequences a simultaneous memory access operation by arranging a read operation before a write operation. Next, the system determines an expected data value for a wildcard symbol in the test procedure by repeating the method used for replacing a wildcard symbol on a typical test procedure. In doing so, the system transforms the test procedure to account for the new sequence ordering, and generates a new test procedure: {(w0,n); (r0,w1); (r1); (r1,w0)}. The system then removes the write operations to generate a test procedure for the second port: {(n); (r0); (r1); (r1)}.

If the memory device gives priority to a write operation (i.e., returns the value of the write operation for a simultaneous read and write operation on a memory cell), then the system sequences a simultaneous memory access operation by arranging a write operation before a read operation. Next, the system determines an expected data value for a wildcard symbol in the test procedure by repeating the method used for replacing a wildcard symbol on a typical test procedure. In doing so, the system transforms the test procedure to account for the new sequence ordering, and generates a new test procedure: {/(w0,n); /(w1, r1); /(r1); (w0,r0)}. The system then removes the write operations to generate a test procedure for the second port: {(n); (r1); (r1); (r0)}.

Note that a test procedure can include a number of simultaneous read and write operations, such that one test element can specify a simultaneous read operation for a first port of a memory device, while a second test element can specify a read operation for a second port of the memory device. In some embodiments, the system can generate a deterministic test procedure which preserves the structure of the original test procedure by first matching the sequence of deterministic read operations to their respective read operations in the original test procedure, and then replacing a wildcard symbol of the original test procedure with a corresponding expected data value from a corresponding deterministic read operation.

In some other embodiments, the system can generate a deterministic test procedure which preserves the structure of the original test procedure by analyzing the original test procedure over a number of iterations. For example, in a first iteration, the system can determine expected data values for a sequence of test operations which perform a simultaneous read operation on a first port of the memory device. Then, in a second iteration, the system can determine expected data values for a sequence of test operations which perform a simultaneous read operation on a second port. Then, a bit stream can be generated based in part on the new deterministic test procedure.

Figure 9:
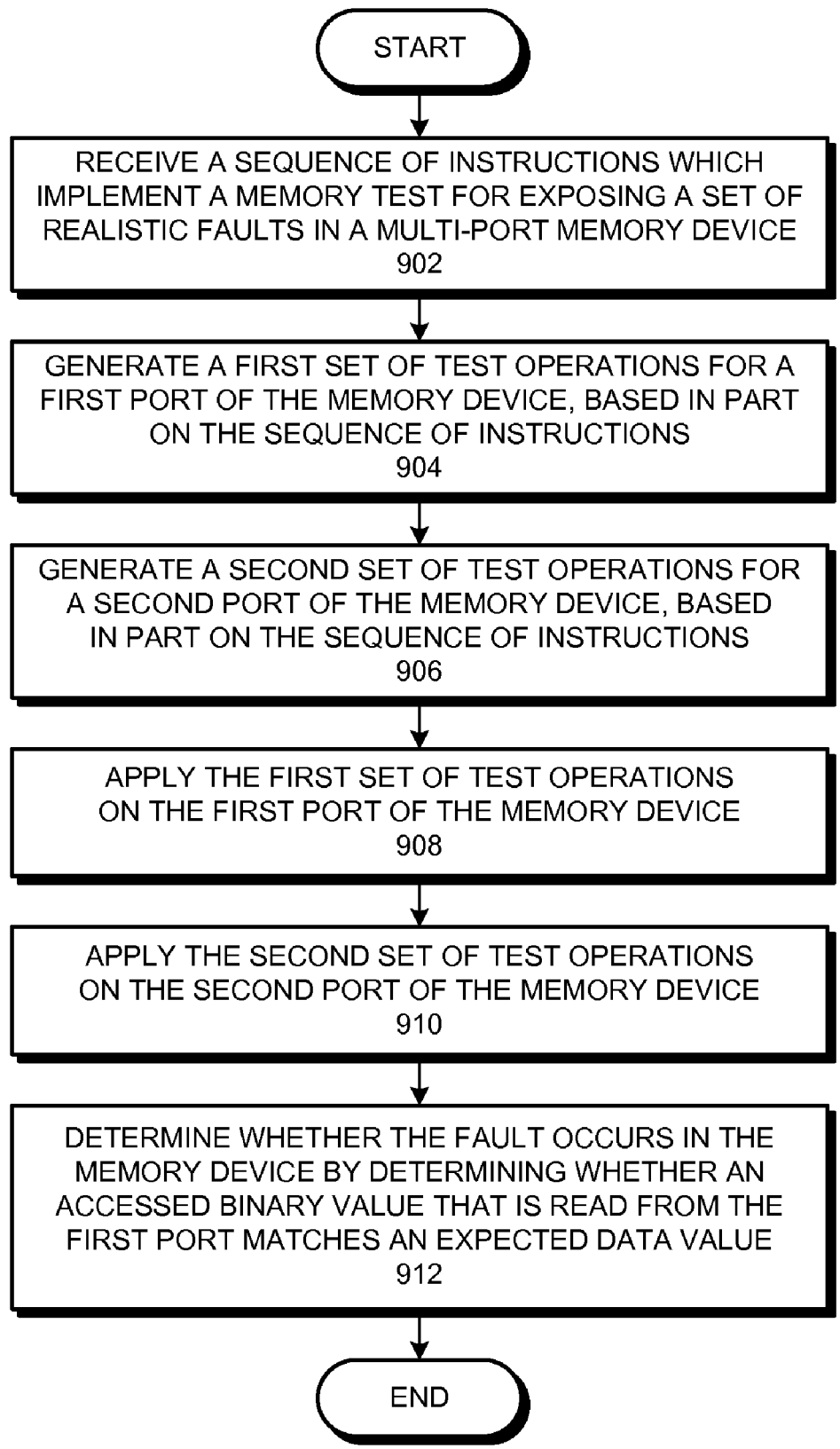
FIG. 9 presents a flowchart illustrating a process for testing a multi-port memory device in accordance with an embodiment.

FIG. 9 presents a flowchart illustrating a process for testing a multi-port memory device in accordance with an embodiment. In some embodiments, the process can be performed by a system configured to test the multi-port memory device. In some variations, the system can be implemented within the memory device, as a BIST solution. In other variations, the system can be implemented as an ASIC device coupled to the multi-port memory device. In further variations, the system can be a computing device in which the memory device is installed.

The system can start by receiving a sequence of instructions which implement a memory test for exposing a fault in the multi-port memory device (operation 902). Then, the system generates a first set of test operations for a first port of the memory device (operation 904), and generates a second set of test operations for a second port of the memory device (operation 906). Next, the system applies the first set of test operations on the first port of the memory device (operation 908), and applies the second set of test operations simultaneously on the second port of the memory device (operation 910). The system then determines whether the multi-port memory fault occurs in the multi-port memory device, by determining whether a binary value read from a read port matches an expected data value (operation 912). Note that if the binary value that is read from the first port or the second port does not match the expected data value, then the system determines that the fault occurs in the memory device.

Figure 10:
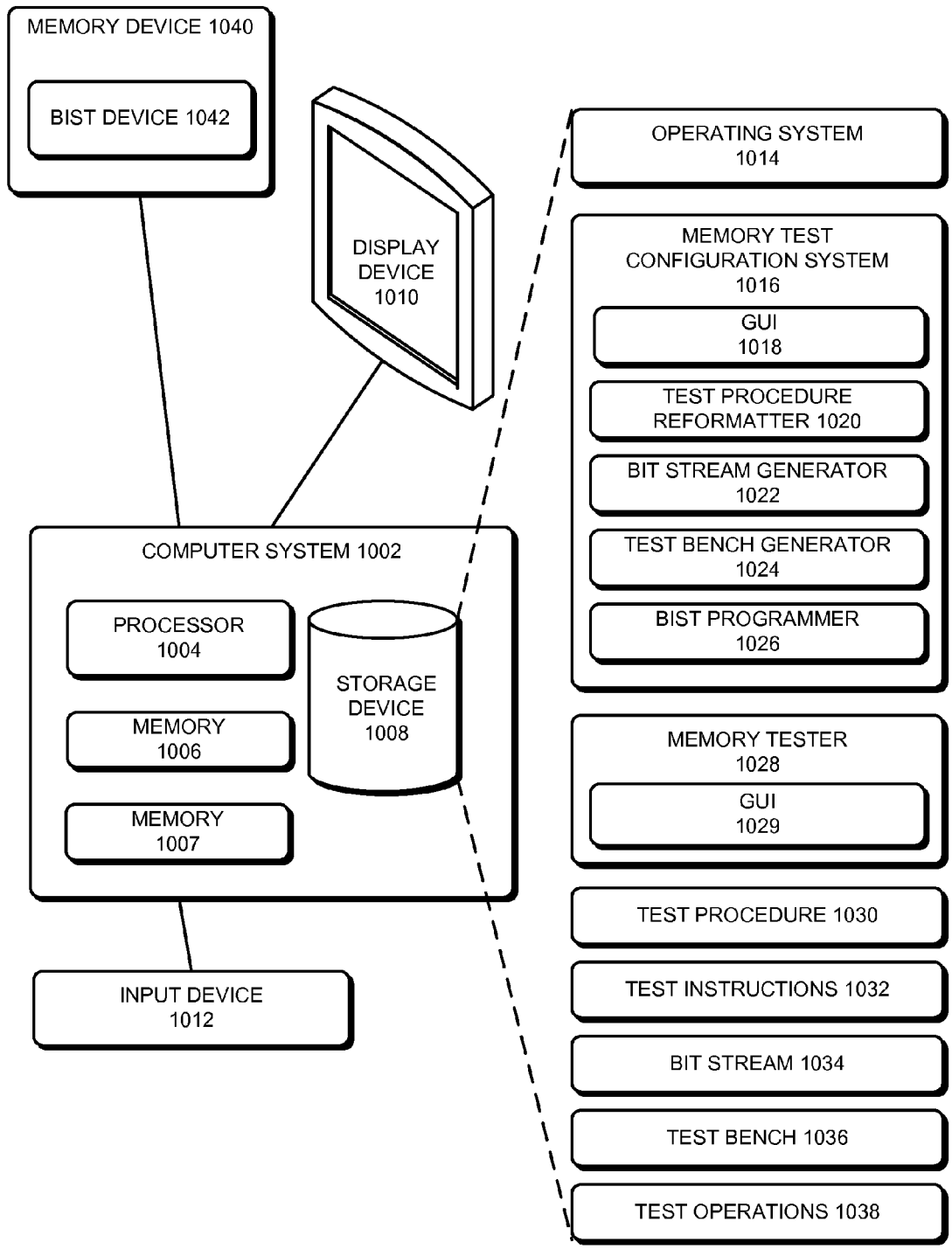
FIG. 10 illustrates an exemplary computer system that facilitates testing a multi-port memory device in accordance with an embodiment.

FIG. 10 illustrates an exemplary computer system that facilitates testing a multi-port memory device in accordance with an embodiment. Computer system 1002 includes a processor 1004, memory devices 1006-1007, and a storage device 1008. Furthermore, computer system 1002 can be coupled to a display device 1010 and an input device 1012.

Storage device 1008 can store an operating system 1014, a memory test configuration system 1016, a memory tester 1028, a test procedure 1030, test instructions 1032, a bit stream 1034, a test bench 1036, and test operations 1038. Memory test configuration system 1016 can include a graphical user interface (GUI) 1018, a test procedure reformatter 1020, a bit-stream generator 1022, a test bench generator 1024, and a BIST programmer 1026. Furthermore, memory tester 1028 can include a GUI 1029.

During operation, memory test configuration system 1016 is loaded from storage device 1008 into memory 1006 and is executed by processor 1004. In some embodiments, memory test configuration system 1016 can configure a BIST device 1042 for testing a multi-port memory device 1040 to detect a multi-port memory device. In doing so, test procedure reformatter 1020 analyzes test procedure 1030 to validate that it does not perform illegal memory access operations on memory device 1040, and reformats the test procedure into a deterministic test procedure which can be used to generate a test sequence. Bit-stream generator 1022 generates a set of test instructions 1032 which implement test procedure 1030, and configures test instructions 1032 into a bit stream 1034. Test bench generator 1024 generates a test bench 1036 which can be used to configure BIST apparatus 1042 for testing memory device 1040. Then, BIST programmer 1026 configures BIST device 1042 to test the memory device under test 1040 based in part on test bench 1036. In some variations, computer system 1002 can be coupled to memory device 1040. In other variations, computer system 1002 can include memory device 1040.

In some embodiments, memory tester 1028 can be implemented in a hardware module within computer system 1002, such as an ASIC or an FPGA. In other embodiments, memory tester 1028 is loaded from storage device 1008 into memory 1006 and is executed by processor 1004. During operation, memory tester 1028 can test multi-port memory device 1007. In doing so, memory tester 1028 can generate test operations 1038 for testing multi-port memory device 1007. Then, memory tester 1028 can apply test operations 1038 to memory device 1007, such that test operations 1038 can perform simultaneous memory access operations on at least two ports of memory device 1007.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method for testing a multi-port memory device to detect multi-port memory fault, wherein the multi-port memory fault affects the memory device when the memory device is accessed simultaneously via a first port and a second port, the method comprising:
receiving a sequence of instructions which implement a memory test;
generating a first set of test operations for the first port of the memory device and a second set of test operations for the second port of the memory device based in part on the sequence of instructions, wherein the first set of test operations is configured to access a first memory cell of the multi-port memory device via the first port, wherein the second set of test operations is configured to access the first memory cell or a second memory cell of the multi-port memory device via the second port, wherein the second memory cell is adjacent to the first memory cell;
applying the first set of test operations to the first port of the multi-port memory device, wherein said applying comprises applying one test operation from the first set of test operations in each iteration;
applying the second set of test operations to the second port of the multi-port memory device, wherein said applying comprises applying one test operation from the second set of test operations in each iteration; and
determining whether the multi-port memory fault occurs in the multi-port memory device by:
inverting, by an irregular-data controller, an expected binary value for the first port in a current iteration in response to determining that a binary value that is being read from the first port in the current iteration was altered by a test operation from the second set of test operations that was performed on the second port during a previous iteration, and
determining whether the accessed binary value that is read from the first port matches the inverted expected binary value.

2. The method of claim 1, wherein the memory test is configured to expose any functional fault which occurs on a single-port memory device.

3. The method of claim 1, wherein the memory test is configured to expose a multi-port memory fault selected from the group consisting of: an inter-port fault, and a cell-array fault.

4. The method of claim 3, wherein an inter-port fault includes a static or a dynamic interaction between two ports of the multi-port memory device, which includes: a coupling fault, a short fault, and an open fault.

5. The method of claim 3, wherein a cell-array fault includes a fault selected from the group consisting of: a concurrent coupling fault, a duplex coupling fault, and a combination of two or more weak faults.

6. The method of claim 5, wherein a realistic coupling fault includes a coupling fault between two memory cells which are physically adjacent or share a common circuit element.

7. The method of claim 1, wherein the accessed binary value that is read from the first port is altered by a previous memory access operation performed on the second port when an odd number of inverting write operations are performed on the second port.

8. The method of claim 1, wherein when an expected value is not known for a read operation in the memory test, the method further comprises computing an expected value for the read operation.

9. A non-transitory computer-readable storage medium storing instructions that when executed by a computer cause the computer to perform a method for testing a multi-port memory device to detect a multi-port memory fault, wherein the multi-port memory fault affects the memory device when the memory device is accessed simultaneously via a first port and a second port, the method comprising:
receiving a sequence of instructions which implement a memory test;
generating a first set of test operations for the first port of the memory device and a second set of test operations for the second port of the memory device based in part on the sequence of instructions, wherein the first set of test operations is configured to access a first memory cell of the multi-port memory device via the first port, wherein the second set of test operations is configured to access the first memory cell or a second memory cell of the multi-port memory device via the second port, wherein the second memory cell is adjacent to the first memory cell;
applying the first set of test operations to the first port of the multi-port memory device, wherein said applying comprises applying one test operation from the first set of test operations in each iteration;
applying the second set of test operations to the second port of the multi-port memory device, wherein said applying comprises applying one test operation from the second set of test operations in each iteration; and
determining whether the multi-port memory fault occurs in the multi-port memory device by:
inverting, by an irregular-data controller, an expected binary value for the first port in a current iteration in response to determining that a binary value that is being read from the first port in the current iteration was altered by a test operation from the second set of test operations that was performed on the second port during a previous iteration, and
determining whether the accessed binary value that is read from the first port matches the inverted expected binary value.

10. The non-transitory computer-readable storage medium of claim 9, wherein the memory test is intended to expose any functional fault which occurs on a single-port memory device.

11. The non-transitory computer-readable storage medium of claim 9, wherein the memory test is intended to expose a multi-port memory fault selected from the group consisting of: an inter-port fault, and a cell-array fault.

12. The non-transitory computer-readable storage medium of claim 11, wherein an inter-port fault includes a static or dynamic fault between two ports of the multi-port memory device, which includes: a coupling fault, a short fault, and an open fault.

13. The non-transitory computer-readable storage medium of claim 11, wherein a cell-array fault includes a fault selected from the group consisting of: a concurrent coupling fault, a duplex coupling fault, and a combination of two or more weak faults.

14. The non-transitory computer-readable storage medium of claim 13, wherein a realistic coupling fault includes a coupling fault between two memory cells which are physically adjacent or share a common circuit element.

15. An apparatus for testing a multi-port memory device to detect a multi-port memory fault, wherein the multi-port memory fault affects the memory device when the memory device is accessed simultaneously via a first port and a second port, the apparatus comprising:
- a scan register configured to receive a sequence of instructions while the apparatus tests the multi-port memory device, wherein the sequence of instructions implements a memory test;
- an instruction register configured to store the sequence of instructions received by the scan register;
- a finite-state-machine-controller configured to generate a sequence of memory access operations for the multi-port memory device based in part on the sequence of instructions;
- a sequence-and-data-generator configured to generate a first set of test operations for the first port of the memory device and a second set of test operations for the second port of the memory device based in part on the sequence of memory access operations, wherein the first set of test operations is configured to access a first memory cell of the multi-port memory device via the first port, wherein the second set of test operations is configured to access the first memory cell or a second memory cell of the multi-port memory device via the second port, wherein the second memory cell is adjacent to the first memory cell;
- first circuitry configured to provide one test operation from the first set of test operations to the first port of the memory device in each iteration, wherein the first circuitry generates a first port control signal, a first port address signal, and a first data signal;
- second circuitry configured to provide one test operation from the second set of test operations to the second port of the memory device in each iteration, wherein the second circuitry generates a second port control signal, a second port address signal, and a second data signal;
- an irregular-data controller configured to invert an expected binary value for a first port in a current iteration in response to determining that a binary value that is being read from the first port in the current iteration was altered by a test operation from the second set of test operations that was performed on the second port during a previous iteration; and
- a response-verification mechanism configured to determine whether the multi-port memory fault occurs in the multi-port memory device by determining whether the accessed binary value that is read from the first port matches the inverted expected binary value.

16. The apparatus of claim 15, further comprising an address generator configured to implement an addressing mode from the group consisting of: an up-addressing mode, a down-addressing mode, a fast x addressing mode, and a fast y addressing mode;
- wherein the address generator is further configured to implement an address offset mode, which preserves a row address offset between the first port's address and the second port's address, and preserves a column address offset between the first port's address and the second port's address.

17. The apparatus of claim 15, further comprising:
- a preset-test-generator configured to provide the instruction register with a predefined instruction sequence which implements one or more default memory tests which target a multi-port memory fault that is likely to occur in the multi-port memory device; and
- a preset-data-generator configured to generate binary values for a sequence of memory access operations associated with the predefined instruction sequence.

* * * * *

UNITED STATES PATENT AND TRADEMARK OFFICE
CERTIFICATE OF CORRECTION

PATENT NO. : 8,042,011 B2
APPLICATION NO. : 12/431522
DATED : October 18, 2011
INVENTOR(S) : Michael Nicolaidis et al.

It is certified that error appears in the above-identified patent and that said Letters Patent is hereby corrected as shown below:

Title Page, Item (75) Inventors: please replace the second inventor's first name with --Slimane-- so that the name reads: "Slimane Boutobza".

Signed and Sealed this
Tenth Day of January, 2012

David J. Kappos
*Director of the United States Patent and Trademark Office*